United States Patent [19]
Mattes et al.

[11] Patent Number: 5,646,454
[45] Date of Patent: Jul. 8, 1997

[54] ELECTRONIC SAFETY DEVICE FOR VEHICLE OCCUPANTS INCLUDING A MEMORY DEVICE FOR STORING FAULT CONDITIONS AND ASSOCIATED CONTROL COMMANDS

[75] Inventors: Bernhard Mattes, Sachsenheim; Werner Nitschke, Ditzingen; Hartmut Schumacher, Freiberg; Klaus Oswald, Baltmannsweiler; Norbert Crispin, Ludwigsburg; Werner Weber, Vaihingen, all of Germany

[73] Assignee: Robert Bosch GmbH, Stuttgart, Germany

[21] Appl. No.: 471,265

[22] Filed: Jun. 6, 1995

[30] Foreign Application Priority Data

Sep. 24, 1994 [DE] Germany ............................ 44 34 204.7
Dec. 30, 1994 [DE] Germany ............................ 44 47 174.2

[51] Int. Cl.$^6$ ............................................ B60R 21/32
[52] U.S. Cl. ........................ 307/10.1; 180/282; 280/735
[58] Field of Search .............................. 307/9.1, 10.1, 307/120, 121; 180/282, 271, 274; 280/734, 735; 340/436, 669, 438, 440

[56] References Cited

U.S. PATENT DOCUMENTS

| | | | |
|---|---|---|---|
| 4,950,914 | 8/1990 | Kurihara et al. | 307/10.1 |
| 4,980,573 | 12/1990 | White et al. | 307/10.1 |
| 5,146,104 | 9/1992 | Schumacher et al. | 307/10.1 |
| 5,365,114 | 11/1994 | Tsurushima et al. | 307/10.1 |
| 5,416,360 | 5/1995 | Huber et al. | 307/10.1 |
| 5,422,965 | 6/1995 | Bekki et al. | 280/735 |

FOREIGN PATENT DOCUMENTS 0 284 728 10/1988 European Pat. Off. .

OTHER PUBLICATIONS

Ingenieur de l'Automobile (1982) No. 6, pp. 69–77.

*Primary Examiner*—Richard T. Elms
*Attorney, Agent, or Firm*—Kenyon & Kenyon

[57] ABSTRACT

In an electronic safety device for vehicle occupants including an acceleration-sensitive sensor, a control unit, and a plurality of inertial restraining devices with associated output stages, a reliable operating mode is guaranteed for the safety device by storing characteristic fault conditions, together with control strategies compensating for these fault conditions. In the event of a fault, the safety device applies the respective, assigned control strategy to activate the restraining devices.

19 Claims, 18 Drawing Sheets

| | SHORT-CIRCUIT TO $U_{Ball}$ AT FP OR (V) BFP | SHORT-CIRCUIT TO $U_{Ball}$ AT FM OR (V) BFM | SHORT-CIRCUIT TO GROUND AT FP OR (V) BFP | SHORT-CIRCUIT TO GROUND AT FP OR (V) BFM | CF OR (V) CBF SHORT-CIRCUITED | ZPF OR (V) ZPBF SHORT-CIRCUITED | ZKF OR ZKBF INTERRUPTED | NO EXISTING FAULT |
|---|---|---|---|---|---|---|---|---|
| 45V | OPERATION ACCORDING TO MOD 1 | OPERATION ACCORDING TO MOD 2 | OPERATION ACCORDING TO MOD 1 | OPERATION ACCORDING TO MOD 2 | OPERATION ACCORDING TO MOD 1 | OPERATION ACCORDING TO MOD 2.2 | OPERATION ACCORDING TO MOD 2.2 | OPERATION ACCORDING TO MOD 2 |
| 30V | OPERATION ACCORDING TO MOD 1.1 | OPERATION ACCORDING TO MOD 2.1 | OPERATION ACCORDING TO MOD 1.1 | OPERATION ACCORDING TO MOD 2.1 | OPERATION ACCORDING TO MOD 1 | OPERATION ACCORDING TO MOD 2.2 | OPERATION ACCORDING TO MOD 3 | OPERATION ACCORDING TO MOD 2.1 |
| 24V | OPERATION ACCORDING TO MOD 3.1 | OPERATION ACCORDING TO MOD 3.1 | OPERATION ACCORDING TO MOD 3.1 | OPERATION ACCORDING TO MOD 3.1 | OPERATION ACCORDING TO MOD 3.1 | OPERATION ACCORDING TO MOD 3.1 | OPERATION ACCORDING TO MOD 3.1 | OPERATION ACCORDING TO MOD 3.1 |
| 9V | | | | | | | | |

EXISTING SYSTEM FAULTS AT THE TRIPPING INSTANT $U_m$

FIG. 2

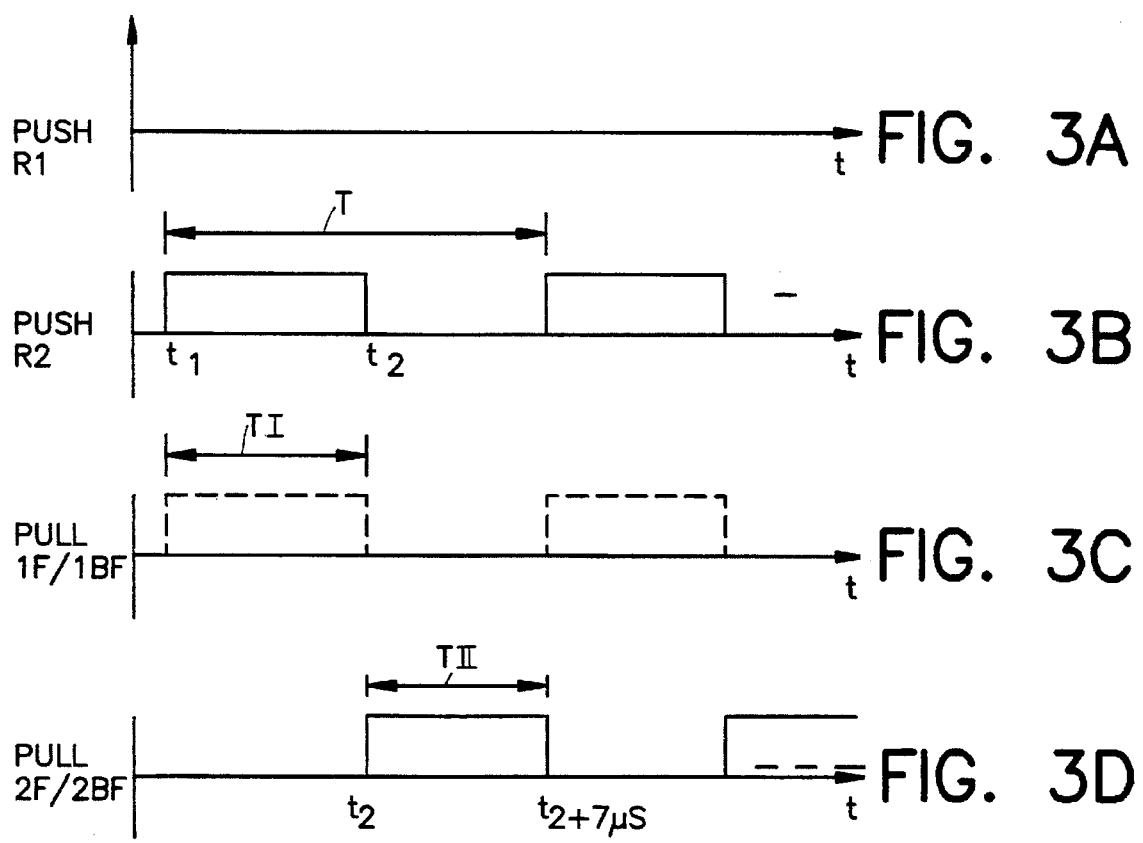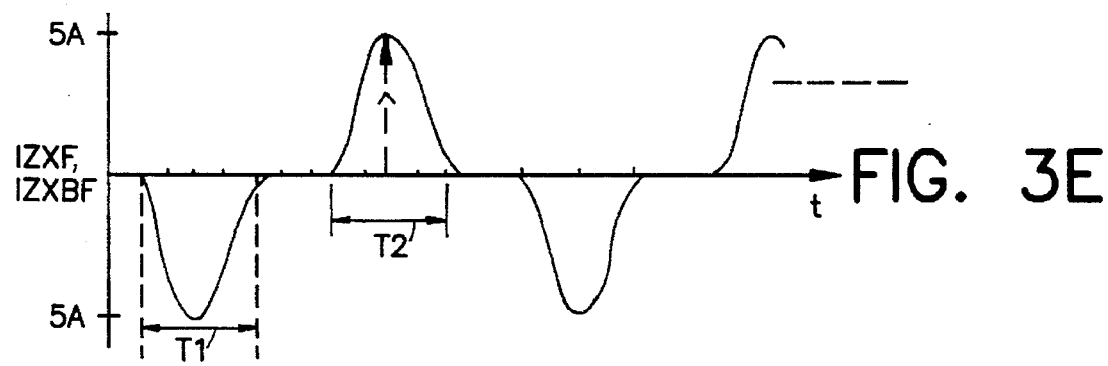

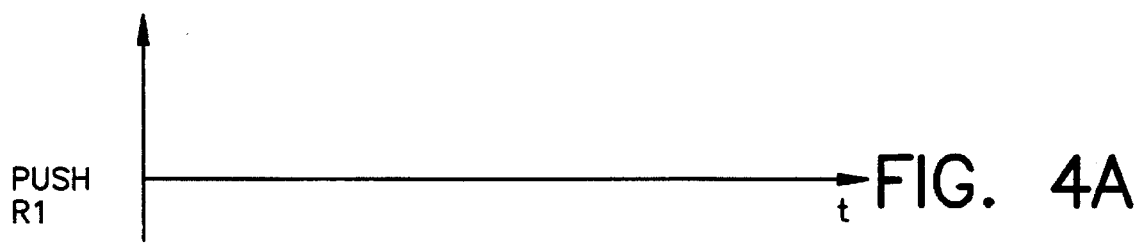
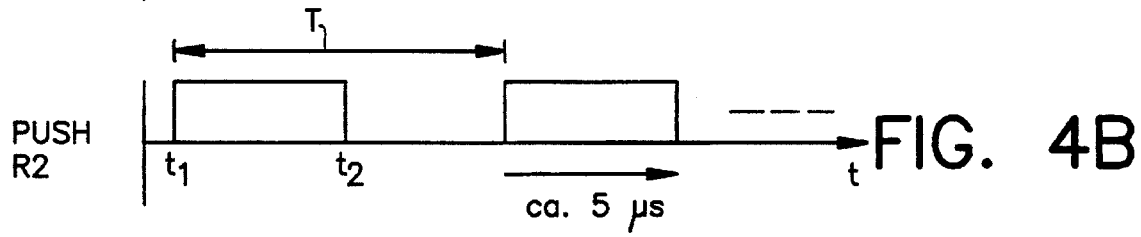
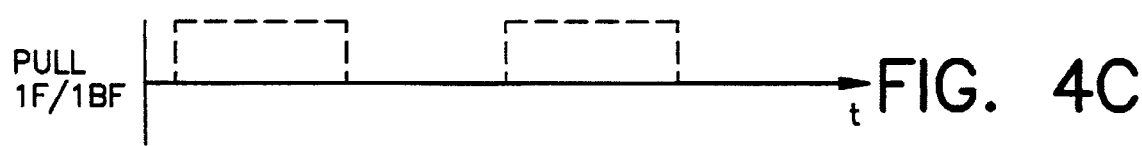
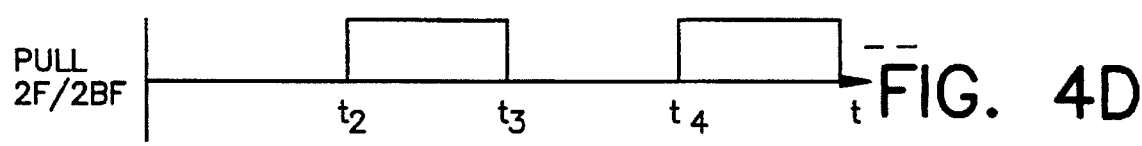
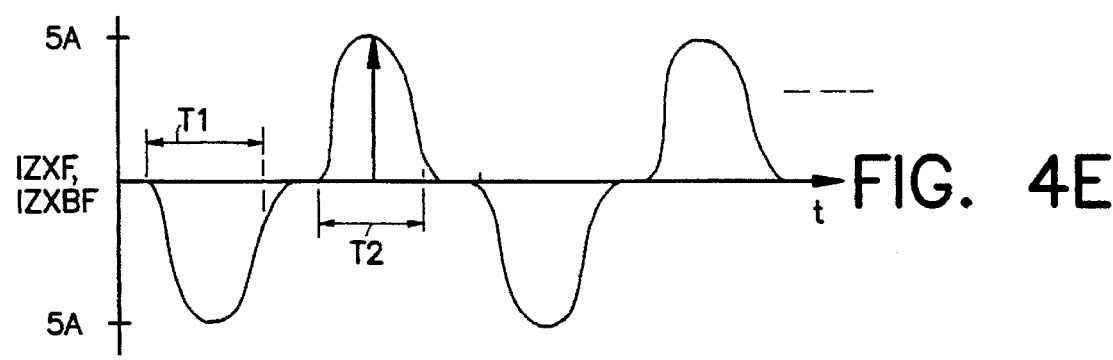

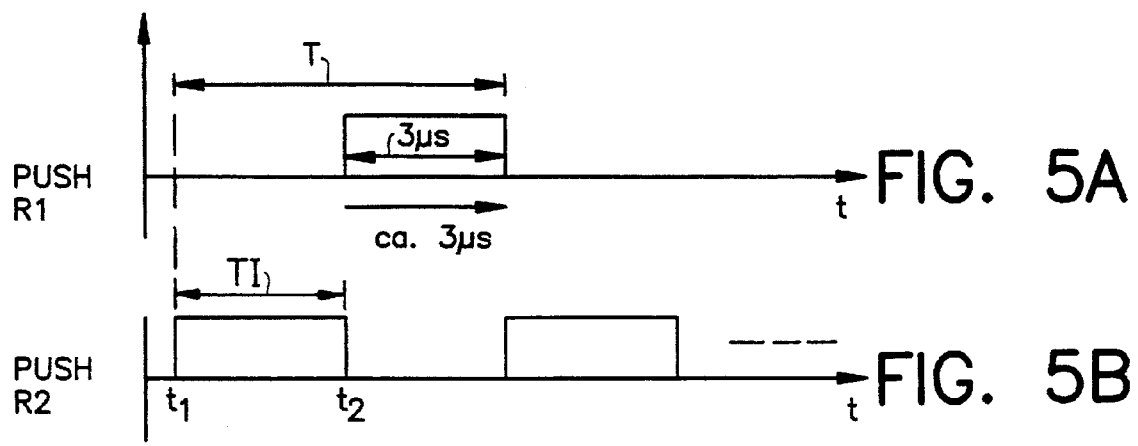
FIG. 5A
FIG. 5B
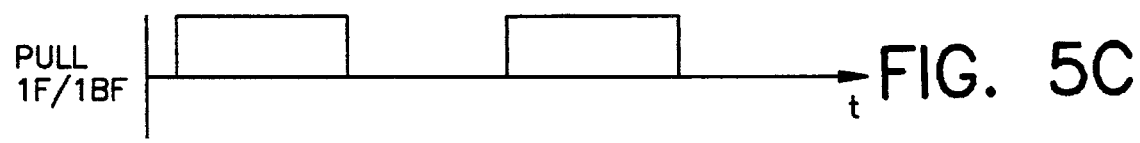
FIG. 5C
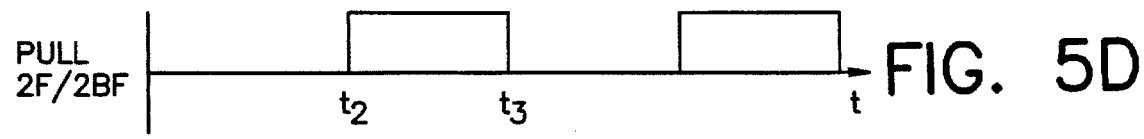
FIG. 5D
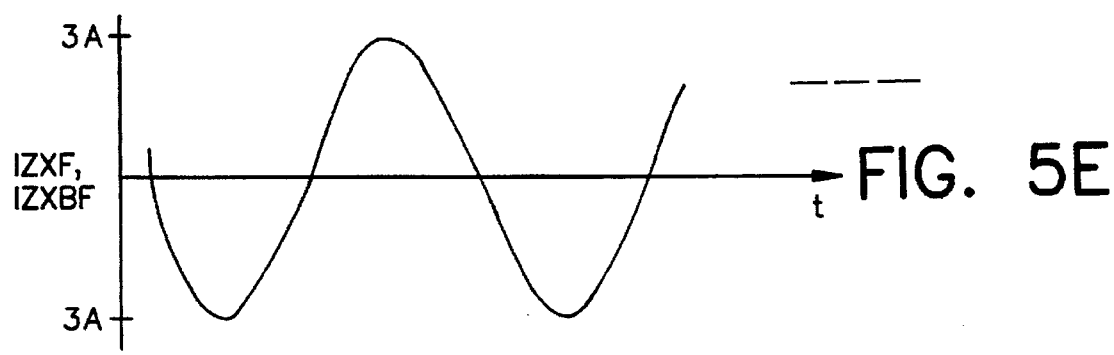
FIG. 5E

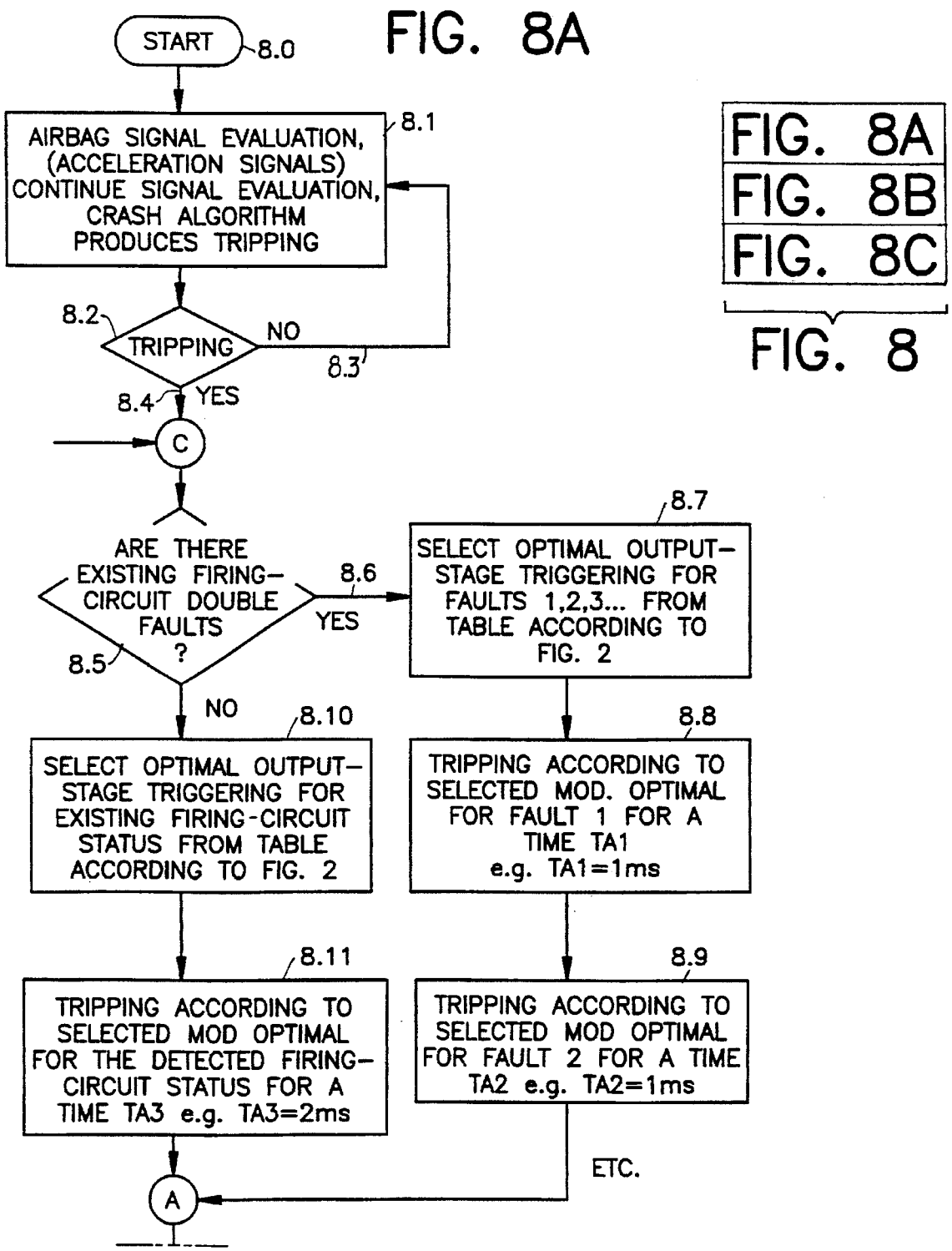

ELECTRONIC SAFETY DEVICE FOR VEHICLE OCCUPANTS INCLUDING A MEMORY DEVICE FOR STORING FAULT CONDITIONS AND ASSOCIATED CONTROL COMMANDS

FIELD OF THE INVENTION

The present invention relates to an electronic safety device for vehicle occupants.

BACKGROUND INFORMATION

An electronic safety device for vehicle occupants is described, for example, from article 1141 in the periodical *Ingénieur de l'Automobile* (1982) no. 6, pp. 69–77. Safety devices of this type must be constantly ready for operation to be able to protect the lives of vehicle occupants in the event of a serious accident. This constant operational readiness must be continually monitored by applying suitable test procedures encompassing as many component parts of the safety device as possible.

European Patent Application No. 0 284 728 describes a safety device for vehicle occupants which comprises a plurality of safety means for vehicle occupants, such as airbags, belt tighteners and/or the like, and a plurality of firing pellets for tripping each of these safety means. To limit the current flow through each of these firing pellets, which is made available from a limited energy reserve, a capacitor is connected in series to each firing pellet. This capacitor permits a current flow through the firing pellet only for as long as it is charged to the voltage level of the energy reserve.

An electronic safety device for vehicle occupants, which likewise has a capacitor connected in series to a firing pellet, is described by U.S. Pat. No. 5,146,104. However, this capacitor has such a small capacitance value that, given a maximum voltage, the charge it contains does not suffice to ignite the firing pellet. It requires, rather, a larger current to ignite the firing pellet, this current only being driven through the firing pellet by repeatedly charging and discharging, or recharging the capacitor connected in series to the firing pellet. A safety device of the last described type is particularly immune to unwanted spurious tripping, since a one-time current flow with the charge contained in the capacitor does not suffice to ignite the firing pellet. Moreover, a process that has already been introduced for igniting the firing pellet can be aborted when it turns out that the airbag does not have to be released after all, for example, due to a comparatively small risk of an accident.

SUMMARY OF THE INVENTION

The safety device according to the present invention renders possible an especially effective monitoring of the safety device and, for that reason, can guarantee a high degree of operational readiness. An especially fast diagnostic capability and an ability to activate the safety means, such as an airbag and/or belt tightener, are achieved, even in spite of a fault detection. In particular, characteristic fault features are stored in a table and, in fact, together with control (embedded) commands, which in spite of the occurrence of a specific fault, nevertheless guarantee a reliable releasing of the airbag.

The availability of an airbag system is considerably enhanced by the development of a safety device in accordance with the block diagram of FIG. 1. Even given a plurality of difficult fault conditions and under very unfavorable operating conditions, it is still possible to achieve a reliable releasing of the airbag. Thus, for example, short-circuits to the vehicle ground (body) or to the positive connection of the voltage supply cannot prevent the firing pellets from being correctly ignited.

The operating mode of the circuit elements T1, T2 and T3, T4 or T5, T6 in push-pull operation rendered possible by the circuit design of the present invention enables a sufficient voltage range to be achieved at the firing circuit capacitors CF, CBF, even given a comparatively small available supply voltage. This makes it easily possible for the airbag safety means to be reliably activated, even given a comparatively low battery voltage of between 9 and 16 volts. In addition, it is also possible to construct safety devices without an additional energy reserve and without an additional voltage transformer when this is required because of cost considerations. By detecting the supply voltage EV, for example before the start of a firing operation and, in some instances, in longer practical time intervals during an ongoing firing operation, for example each time in a millisecond interval, the driving of the circuit elements according to the present invention is able to be quite advantageously adapted each time to the existing conditions.

Thus, it is achieved that the firing pellet is loaded with a substantially constant firing current so that the reliability of protection against false releases is considerably increased. Since the average firing current can be held by the firing pellet per power stroke T to a favorable average value of approximately 2 amperes, an unwanted releasing does not happen, even when a firing pellet is mistakenly triggered with up to 20 clock cycles. On the other hand, the safety device according to the present invention also makes it possible to deal extremely wastefully with firing energy, so that under certain fault conditions, a triggering of the firing pellet and a reliable releasing of the airbag are vigorously forced. This is especially the case in the event of short-circuits of the firing pellet, in which one still attempts to intercept (check) shunts on the order of magnitude of about 0.5 to 1 ohm to nevertheless supply sufficient firing energy to the firing pellet. In this fault case, through a correspondingly suitable method of operation, the circuit design of the present invention makes it possible to substantially increase the current flow to nevertheless induce the firing.

Another special case is firing circuit interruption, which is assumed given a resistance of about 10 ohms. In this case, through a suitable operating method, it is useful to effect a high enough voltage range at the capacitors CF, CBF of the firing circuit early on to achieve a reliable triggering. To detect the existing fault condition of the safety device within the tripping instant, the most favorable operating mode can be selected by choosing a suitable control strategy in order to achieve the most favorable tripping effect corresponding to the existing situation. Furthermore, it is especially advantageous that an already selected control strategy can still be checked, if necessary, and for example, altered again, should another control strategy prove to be more favorable.

For example, after a certain control strategy is selected, in about a 1 millisecond interval, it can be checked whether a control strategy that has been selected for an ascertained fault condition is optimally suited or not. In the case that it is not suited, the switch can be made, if indicated, to a better adapted control strategy still before the next power stroke is complete. Accordingly, the safety device according to the present invention makes an optimal utilization of firing energy possible, which is of particular importance when the vehicle battery has already been turned off and only the extremely limited energy reserve is still available.

In addition, the exceptional advantage is attained that, even in the event of so-called double faults in the area of the firing circuits, an optimal control strategy can be used to compensate for the first fault for a specific period of time of the tripping operation. In addition, an optimal control strategy can be used to compensate for the second fault during another period of time of the tripping operation. For example, a first strategy can be applied for about a 1 millisecond time period to eliminate a first fault condition, and another control strategy for another millisecond time period to eliminate a second fault condition.

In one especially advantageous refinement of the present invention, fault conditions that have been recognized through regular checking of the safety device can also be stored in a memory area of the microcontroller. Should it become necessary later on, in conjunction with an accident situation, to trigger the safety means, these stored fault conditions can be called again and still be considered along with other conditions in selecting the suitable control strategy for triggering the firing pellets. Thus, an acute fault occurring during the tripping operation could lead, for example for a time duration of about 4 milliseconds, to a first control strategy being selected, which compensates for the acute fault condition that is occurring; in a subsequent time interval, a different control strategy could then be selected, which also still considers the fault conditions previously stored.

BRIEF DESCRIPTION OF THE DRAWINGS

FIG. 2 shows a table with fault conditions and fault-dependent control commands according to the present invention.

FIGS. 3a–3e, 4a–4e, 5a–5e, 6 and 7 illustrate timing diagrams for clarifying certain fault conditions and resultant control processes according to the present invention.

FIGS. 8a, 8b and 8c, which collectively constitute FIG. 8, show a flow chart illustrating the fault detection and the controlling of the airbag release resulting from the fault detection according to the present invention.

DETAILED DESCRIPTION OF THE INVENTION

Figure 1:
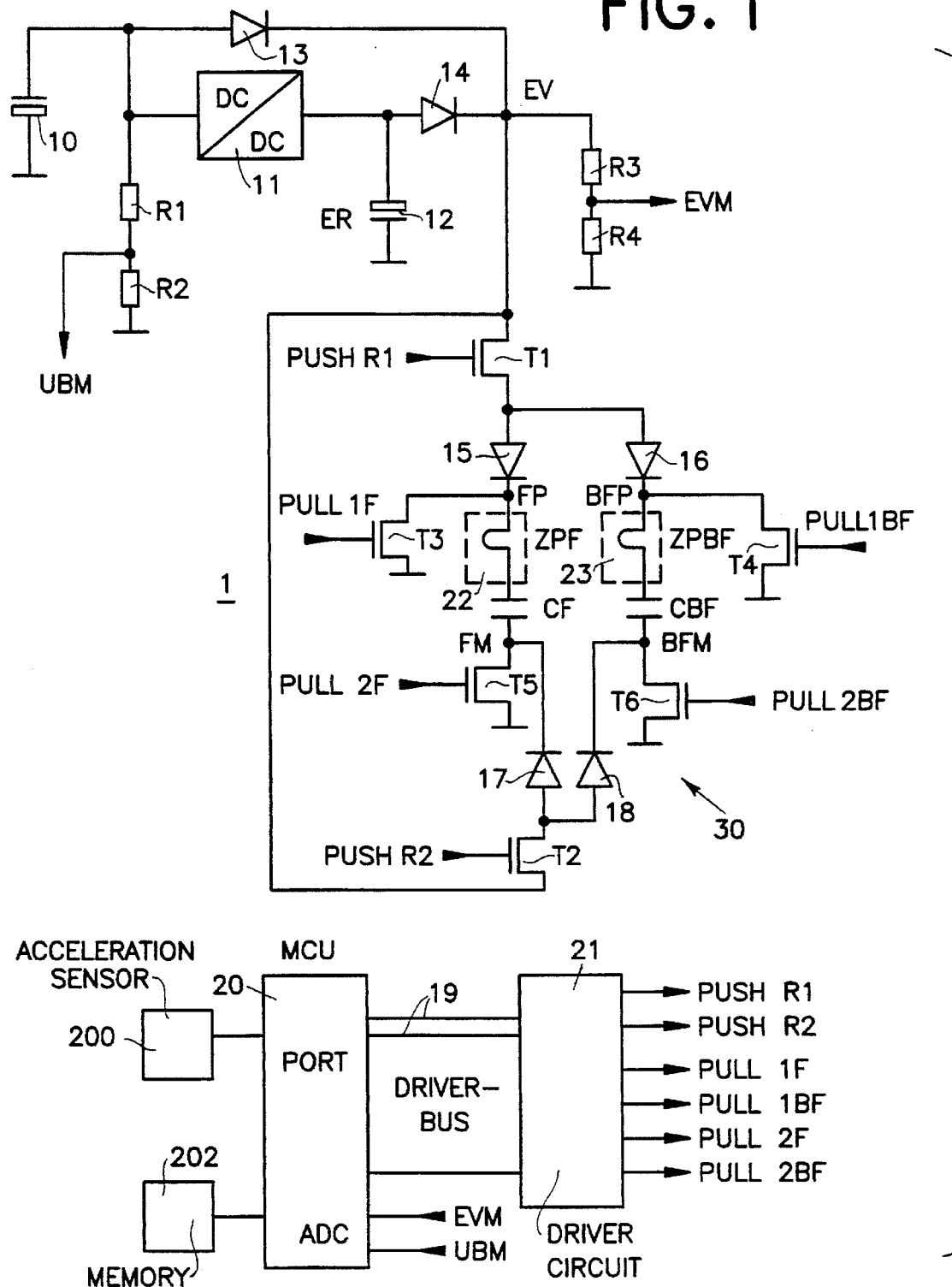
FIG. 1 shows a circuit and block diagram of the safety device according to the present invention.
Figure 6A:
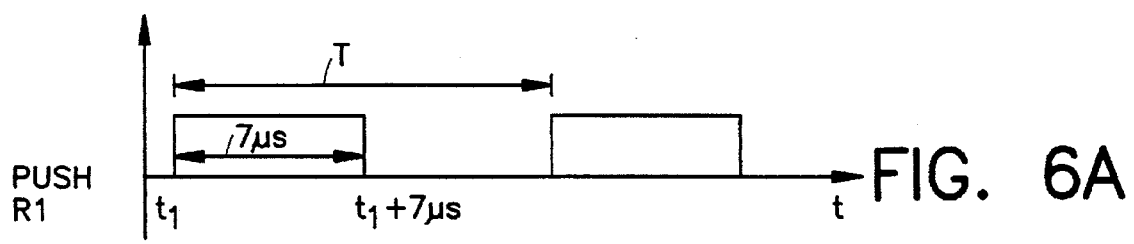
Figure 6B:
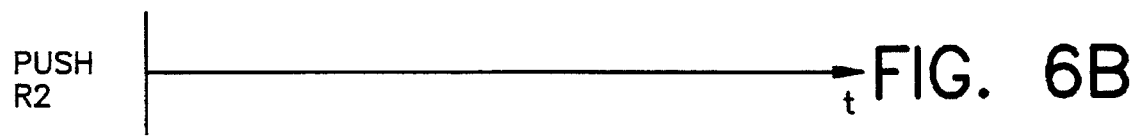
Figure 6C:
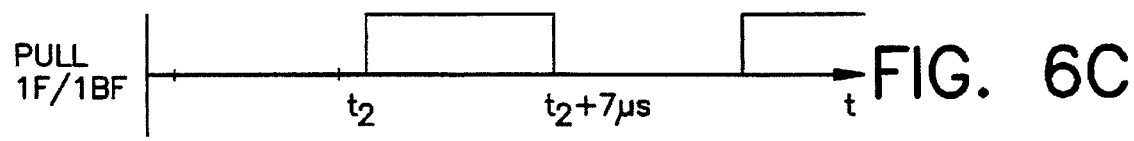
Figure 6D:
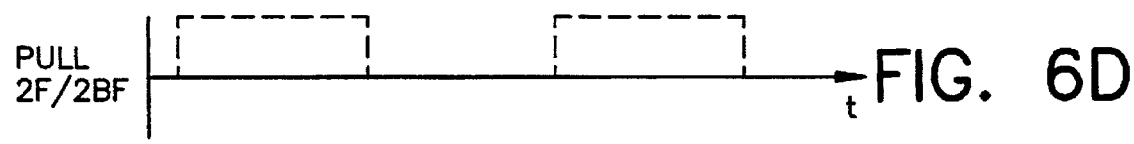
Figure 6E:
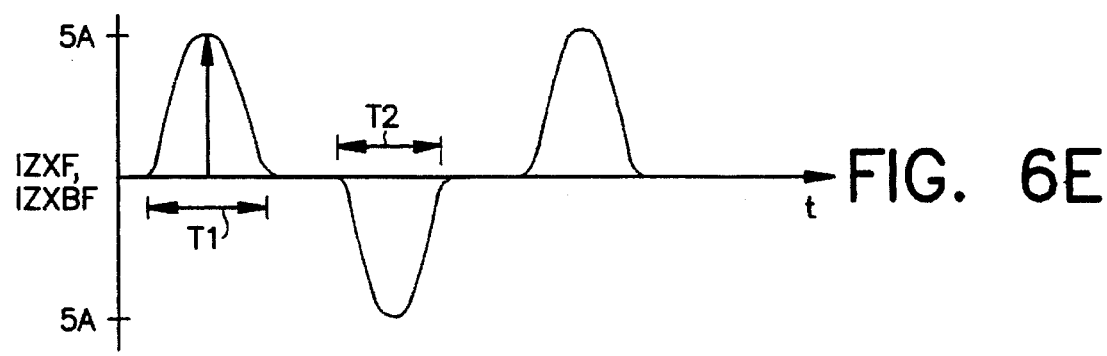
Figure 7A:
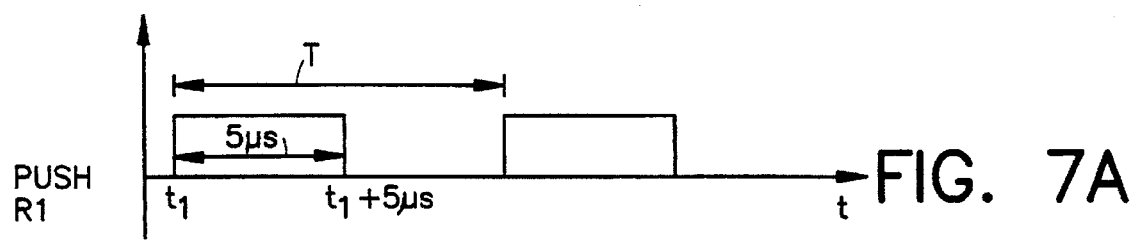
Figure 7B:
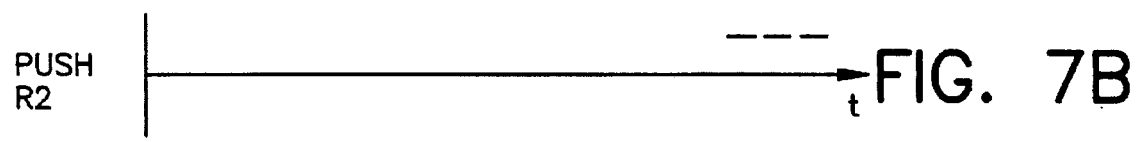
Figure 7C:
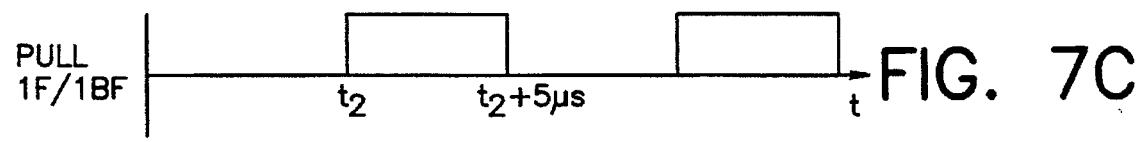
Figure 7D:
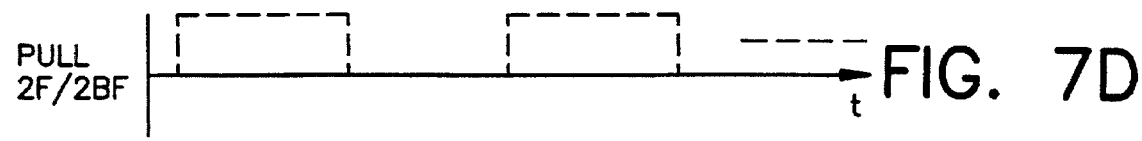
Figure 7E:
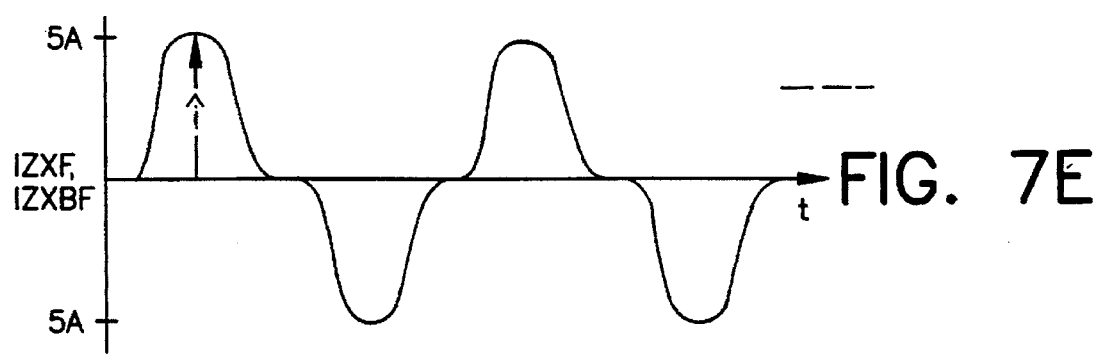

FIG. 1 shows a circuit and block diagram of the safety device according to the present invention for vehicle occupants. The safety device is arranged in a vehicle, preferably in a land vehicle, such as in a passenger car or truck, and is used to protect the occupants in the event of a serious accident by activating a safety means, such as an airbag and/or belt tightener, or the like. The safety device is connected to the battery 10 of the motor vehicle, which supplies it with current. Connected in parallel to the battery 10 is a voltage divider comprising the resistors R1, R2. The pick-off (tap) of the voltage divider R1, R2 is connected via a line UBM to an input terminal (analog/digital input) of a microcomputer 20. Via this line UBM, a voltage value can be tapped off of the voltage divider R1, R2 in order to control the voltage of the vehicle battery 10. Usually, the vehicle battery 10 is connected by its negative terminal to the mass frame (ground) connection of the vehicle.

Connected to the positive terminal of the vehicle battery 10 is an input terminal of a d.c. voltage converter 11, whose output terminal is connected to the positive terminal of an energy reserve 12, and whose negative terminal is likewise connected to the mass frame connection. A capacitor having comparatively large capacitance, for example a few thousand microfarad, is suited as an energy reserve 12. This energy reserve 12 is provided so that the electronic safety device also will still be supplied, at least for a limited time, with current and even remain functional, in the case that the connection to the vehicle battery 10 is interrupted in the event of an accident.

The energy reserve 12 is expediently charged by the d.c. voltage converter 11 to a voltage equivalent to several times the voltage of the vehicle battery 10. When, for example, the vehicle electrical system is rated for about 2 volts d.c. voltage, the energy reserve 12 is charged, for example, to a voltage value of 45 to 50 volts. In the same way as the positive terminal of the energy reserve 12, the positive terminal of the vehicle battery 10 is connected via a diode 13, 14, which is polarized in the conducting direction, to the high point of a second voltage divider R3, R4, whose base point is likewise connected to ground. The pick-off (tap) of the voltage divider R3, R4 is connected via a line EVM to a second input terminal (analog/digital conversion) of the microcontroller 20. A partial voltage can be tapped off by way of this line EVM in order to control the voltage being applied to the voltage divider R3, R4.

Connected to the connection (junction) point of the diodes 13, 14 are first switching connections to each of circuit switching element T1 and T2, whose second switching connection leads in each case to the interconnected anode terminals of two diodes 15, 16 and 17, 18, respectively. A first firing pellet squib ZPF (e.g., for the driver airbag) and a first capacitor CF are connected in series, one behind the other, between the cathode terminals of the diodes 15, 17. A second firing pellet ZPBF (e.g., for the front-seat passenger) and a second capacitor CBF are brought into the circuit between the cathode terminals of the diodes 16, 18.

Linked to the connection point between the cathode terminal of the diode 15 and the firing pellet ZPF is a first switching connection of another circuit element T3, whose second switching connection is connected to ground. Likewise connected to the connection point between the cathode terminal of the diode 17 and the capacitor CF is a first switching connection of another circuit element T5, whose second switching connection is likewise connected to ground. A first switching connection of a circuit element T4, whose second switching connection is connected to ground, is connected to the connection point between the cathode terminal of the diode 16 and the firing pellet ZBPF. In addition, a first switching connection of the circuit element T6, whose second switching connection is connected to ground, is connected to the connection point between the cathode terminal of the diode 18 and the capacitor CBF.

The gate terminals of all circuit elements T1, T2, T3, T4, T5, T6 are linked, respectively, via line connections PushR1, PushR2, Pull1F, Pull1BF, Pull2F and Pull2BF to corresponding output terminals of a driver circuit 21, which are connected via corresponding bus lines 19 to output terminals of the microcontroller 20 and are triggered by the microcontroller 20. The firing pellets ZPF, ZPBF are in a thermal operative connection with propellant charges (not shown in detail) of the airbags 22, 23 provided as safety means for vehicle occupants. Here, thermal operative connection means that the firing pellets ZPF, ZPBF, which are heatable by the passage of current, are capable in the heated state of activating a propellant charge, which inflates the airbags 22, 23.

The method of functioning of the safety device according to the present invention depicted in FIG. 1 is clarified in the following with reference to the other Figures. FIG. 2 depicts, in tabular form, possible fault conditions of the safety device and fault-dependent control commands, which, in spite of the fault condition, are still supposed to achieve a reliable releasing of the airbag 22, 23. Fault conditions and fault-dependent control commands are expediently stored in memory means 202, which can also be a component of the microcomputer 20. The diverse fault conditions are listed in the first row of the Table. Specifically, these fault conditions are:

Short-circuit (KS) to the positive terminal of the vehicle battery 10 or to the energy reserve 12 at the circuit points FP or BFP;

Short-circuit to the positive terminal of the vehicle battery 10 or to the energy reserve 12 at the circuit points FM or BFM;

Short-circuit to ground at the circuit points FP or BFP;

Short-circuit to ground at the circuit points FM or BFM;

Short-circuit of the capacitors CF or CBF;

Short-circuit of the firing pellets ZBF or ZPBF;

Interruption of ZKF or ZKBF;

No existing fault.

Listed in the three rows underneath the fault conditions are control commands. The control commands are assigned to each fault condition and are each dependent on the existing available supply voltage EV (e.g., whether the supply voltage lies between 9 and 24 volts, between 24 and 30 volts, or between 30 and 45 volts). A characteristic map that is dependent upon the input parameters —fault condition and level of the supply voltage EV, renders possible both an extremely rapid fault diagnosis, as well as an extremely effective triggering of the firing pellets ZPF, ZPBF, and consequently renders possible activation of the airbags 22 and 23. For purposes of clarification, two matrix fields are selected from the Table shown in FIG. 2.

Assume, for example, that a short-circuit to the positive pole of the vehicle battery 10 or to the energy reserve 12 at the circuit point FP of BFP exists (see fault condition in column 1, row 1 of the Table). Depending on the existing available level of the supply voltage EV, different control strategies are then pursued, so that, in spite of the detected fault condition, the firing pellets ZPF, ZPBF are nevertheless sufficiently loaded with ignition current to reliably trigger the airbags 22, 23.

For example, within a voltage range for the supply voltage EV of between 9 volts and 24 volts, a control strategy MOD 3.1 is pursued (see column 1, row 4), which will be explained further on the basis of FIGS. 5a–5e. On the other hand, given a voltage range for the supply voltage EV of between 24 volts and 30 volts and the previously described fault condition, a control strategy MOD 1.1 is pursued (see column 1, row 3), which will be explained further with reference to FIGS. 4a–4e. Finally, given a supply voltage of between 30 volts and 45 volts and the previously described fault condition, a control strategy according to MOD 1 is pursued (see column 1, row 2), which will be explained further on the basis of FIGS. 3a–3e. The equivalent applies to the other positions of the Table shown in FIG. 2, which will each be clarified further below.

With reference to FIG. 3a–3e, the control strategy MOD 1 is initially clarified, which in accordance with the Table in FIG. 2 is used when a short-circuit to the positive terminal of the vehicle battery 10 or to the energy reserve 12 is detected at points FP or BFP shown in FIG. 1 and, at the same time, a level of the supply voltage EV is determined to be within the range of between 30 volts and 45 volts (see column 1, row 2). The same control strategy is applied in accordance with the Table of FIG. 2 when a short-circuit is ascertained to ground at the circuit points FP or BFP or a short-circuit of the capacitors CF or CBF (see column 3, row 2 and column 5, row 2).

The control strategy in accordance with MOD 1 is especially favorable when there is a short-circuit between the circuit points FP, BFP to the positive pole of the supply voltage. In this case, both fault conditions are uncovered, i.e. either there is a short-circuit between the circuit points FP or BFP, or both circuit points are short-circuited to the positive pole of the supply voltage. In these cases, the voltage range of the capacitors CF, CBF situated in the firing circuits is independent of the level of the voltage of the vehicle battery 10. For that reason, the duration of the current flow through the firing pellets ZPF, ZPBF is not influenced by the fault short-circuit to the positive terminal of the voltage supply. Accordingly, in comparison to a fault-free firing circuit, a change in the passage of current through the firing pellets ZPF, ZPBF caused by a short-circuit to the positive pole of the supply voltage does not result in a change in the time delay for releasing the airbags 22, 23.

The essential signal patterns, which are significant for the control strategy MOD 1, are shown in FIGS. 3a–3e. This representation assumes a minimal firing circuit inductance of approximately 2 microhenry. By means of the conductively controlled (i.e. controlled to conduct current) circuit element T2 (via control line Push R2), the capacitors CF, CBF arranged in the firing circuits are first charged against a short-circuit possibly existing at the circuit points FP or BFP to the positive terminal of the supply voltage. The circuit elements T3, T4 also are able to be conductively controlled (via control lines Pull1F, Pull1BF) to counteract a short-circuit to the positive voltage terminal or to determinately connect to ground the circuit point FP or BFP, where no short-circuit exists. In this manner, short-circuit situations, which are coupled via diodes, are able to be brought under control. It is apparent from FIG. 3b that the triggering of the circuit element T2 takes place with clock-pulse timing and begins, for example, at the instant t1 on the time axis t. The circuit element T2 is then conductively controlled for a time period of around 7 microseconds. Following this, the circuit element T2, as revealed in FIG. 3b, is again blocked for a time period of 7 microseconds to then again be conductively controlled for about 7 microseconds. The conductive time interval and the blocked time interval can vary between 3 to 10 microseconds, 5 to 10 microseconds, or 2 to 8 microseconds. The conductively controlled time phases each follow in a time interval of T.

As already mentioned previously, in accordance with FIG. 3c, the circuit elements T3, T4 also can still each be conductively controlled in the conductive phase of the circuit element T2. After that, the circuit elements T2 and in some instances also T3 and T4 are blocked by appropriate triggering on the associated control lines PushR2, Pull1F, Pull1BF, and the circuit elements T5 and T6 (see FIG. 3d) are conductively controlled. The conductive phase of the circuit elements T5, T6 begins at the instant t2 and likewise continues for about seven microseconds. By means of this control process, the capacitors CF, CBF arranged in the firing circuits are charged in the reverse direction. FIG. 3e illustrates, as a function of time, the current pulses IZKF, IZKBF, which are produced by the previously described triggering of the firing circuits and are received by the firing pellets ZPF or ZPBF. Since it is sufficiently known which quantity of energy is needed to reliably activate a firing pellet, it can be simply determined how many of such current pulses are needed to activate the firing pellets.

With reference to FIGS. 4a–4e, the control mode MOD 1.1 is now described, which is used in accordance with the Table of FIG. 2 when, for example, there is a short-circuit to the positive pole of the supply voltage at the circuit points FP or BFP (see column 1, row 3 of the Table in FIG. 2), or a short-circuit to ground at the circuit points FP or BFP (see column 3, row 3 of the Table in FIG. 2). The operating mode in accordance with MOD 1.1 considers the decline in the supply voltage to a value lying between 24 and 30 volts. By means of this parameter, the triggering of the firing pellets can be adjusted so as to allow the passage of current through the firing pellets to be kept within a precisely defined range. As far as is known, for the first time a type of pulse-width modulation is hereby proposed for controlling the passage of current in the case of firing pellets in an airbag control unit, the existing value of the supply voltage being considered during the occurrence of an accident and during the process of igniting the firing pellets. It is not necessary to go into further detail with regard to the signal diagrams depicted in FIGS. 4a–4e, as they essentially correspond, except for slightly different triggering times, to signal patterns according to FIGS. 3a–3e, which were already discussed in detail.

The circuit elements T1 through T6 are triggered both in the case of MOD 1 as well as MOD 1.1 so as to allow a maximum of about 5 amperes current (IZKF, IZKBF) to flow, when the voltage conditions permit it. The operating modes MOD 1 and MOD 1.1 are likewise suited for a triggering operation in the event of a short-circuiting of the circuit points FP or BFP to ground, without any loss of power occurring. Moreover, the above-mentioned operating modes also are suited in the event of a short-circuiting of the capacitors CF, CBF without any substantial power losses, since about 2.5 amperes firing current can still be made available, which suffices for the activation.

The control strategy MOD 3.1. will now be clarified on the basis of FIGS. 5a–5e. This operating mode considers the decrease in the supply voltage within the voltage range of between about 9 volts and 24 volts. This state occurs, for example, in the case of a defective energy reserve 12 or in the case of too long a period of time between the breaking away of the vehicle battery 10 and a subsequent occurrence of a serious accident. In addition, a situation of this type can exist in the case of safety devices which have to make do without an energy reserve and d.c. voltage converter.

In the least favorable case of an existing short-circuit to the positive pole of the supply voltage, average firing-circuit currents on the order of magnitude of about 2 amperes still result because of the remaining small voltage range of about 6 volts at one considered capacitor CF, CBF of a respective firing circuit, under consideration of an inductance of the firing circuit of about 2 microhenry. This is rendered possible by an optimal triggering within the resonance range of the firing circuits and by the hereby proposed triggering of the circuit elements T1, T2 or T3, T4 and T5, T6 in push-pull operation. By this means, even in the least favorable case, a voltage range of about 12 volts can still be made available at the capacitors CF, CBF in the firing circuit.

With reference to FIG. 6 and FIG. 7, the control strategies MOD 2 and MOD 2.1 will be described. These operating modes have proven to be especially favorable when there is a short-circuit from the circuit points FM of the driver-side airbag or BFM of the passenger-side airbag to the positive terminal of the supply voltage, or a short-circuit from both. In this case, the voltage range at the capacitors CF, CBF of the firing circuits is likewise independent of the level of the battery voltage of the vehicle battery ($U_{Bat}$ approximately 9 to 16 volts).

In this manner, the current flow duration through the firing pellets ZPF, ZPBF is not influenced by the fault short-circuit to the positive pole of the supply voltage. These operating modes are possible in that the safety device depicted in FIG. 1 has two separately controllable circuit elements T1, T2 in the firing output stage. It is not necessary to discuss the curve shapes shown in FIG. 6 and FIG. 7 in greater detail, since they apply analogously in this case to the explanations made already with regard to the operating modes MOD 1 and MOD 1.1. The operating modes MOD 2 and MOD 2.1 are likewise particularly well suited for a control operation in the case that the type of fault is a short-circuit to ground at the circuit points FM or BFM, without any power loss being observed in this case. The same also applies for a triggering of the firing circuits in the event of freedom from faults.

The operating mode MOD 2.2 is then particularly well suited as a control strategy when the safety device detects a short-circuit of a firing pellet ZPF, ZPBF of a firing circuit. If this short-circuit has a value that differs from 0 ohm and that lies, for example, within the range of greater than 0 ohm and less than 1 ohm, then it can prove to be practical by means of an appropriate clock timing control (pulse-width modulation) to load the firing pellets ZPF, ZPBF at least for a certain time with the highest possible passage of current. Given an assumed firing circuit inductance of about 2 microhenry, the self-resonance point is adjusted with a triggering duration of about 6 microseconds. Given a short-circuit resistance value of approximately 0.5 ohm, current values of about 1 ampere are still produced through the firing pellet. The smaller supply voltage on the order of magnitude of 24 volts to 30 volts is to be applied, given a requirement for a high passage of current through the firing pellets, for the fault condition short-circuit of the firing pellets (remaining resistance of approximately >0 ohm to <1 ohm).

By triggering the two circuit elements T1, T2 in push-pull operation, the voltage range at the capacitors CF, CBF of the firing circuits is doubled, so that the limited maximum current can flow. By limiting the application of this operating mode to lower supply voltages, no excessively high blocking voltages occur at the circuit elements, so that very cost-effective discrete semiconductor components can be used, or also integrated semiconductor components as circuit elements can be used.

The operating mode MOD 3 is likewise particularly well suited in the event of a fault that is an interruption in the firing circuits. This fault condition is assumed, for example, when the resistance levels in the firing circuit exceed the value of about 10 ohms. Given such high firing-circuit resistance levels, it is then useful to assure in a timely fashion that there will be a sufficient voltage range at the components of the firing circuits (e.g, firing pellet, capacitor), so that the firing current can be held to the minimally required value of about 2 amperes. This is achieved by the push-pull operation of the circuit elements T1, T2 or T3, T4 and T5, T6.

Figure 8B:
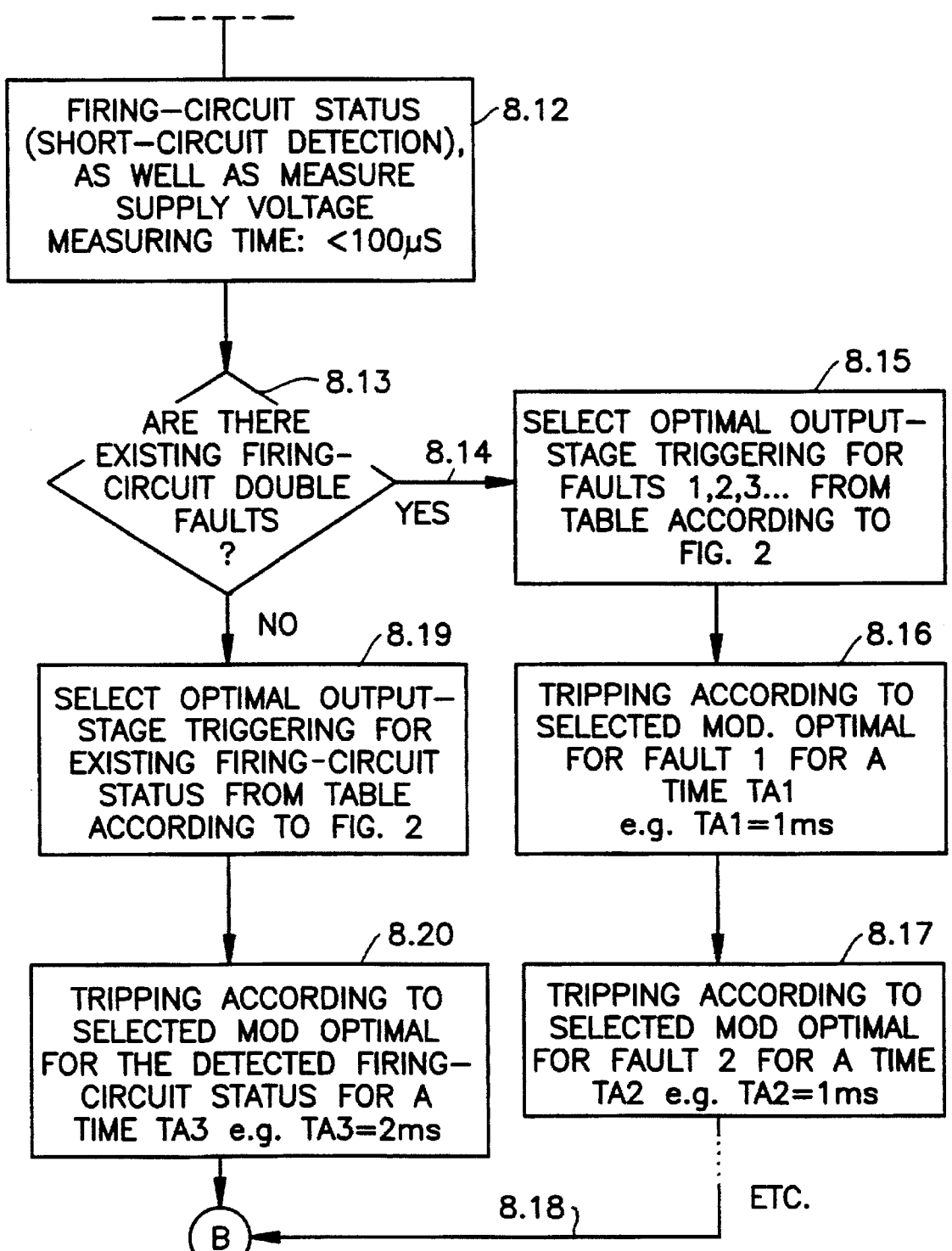
Figure 8C:
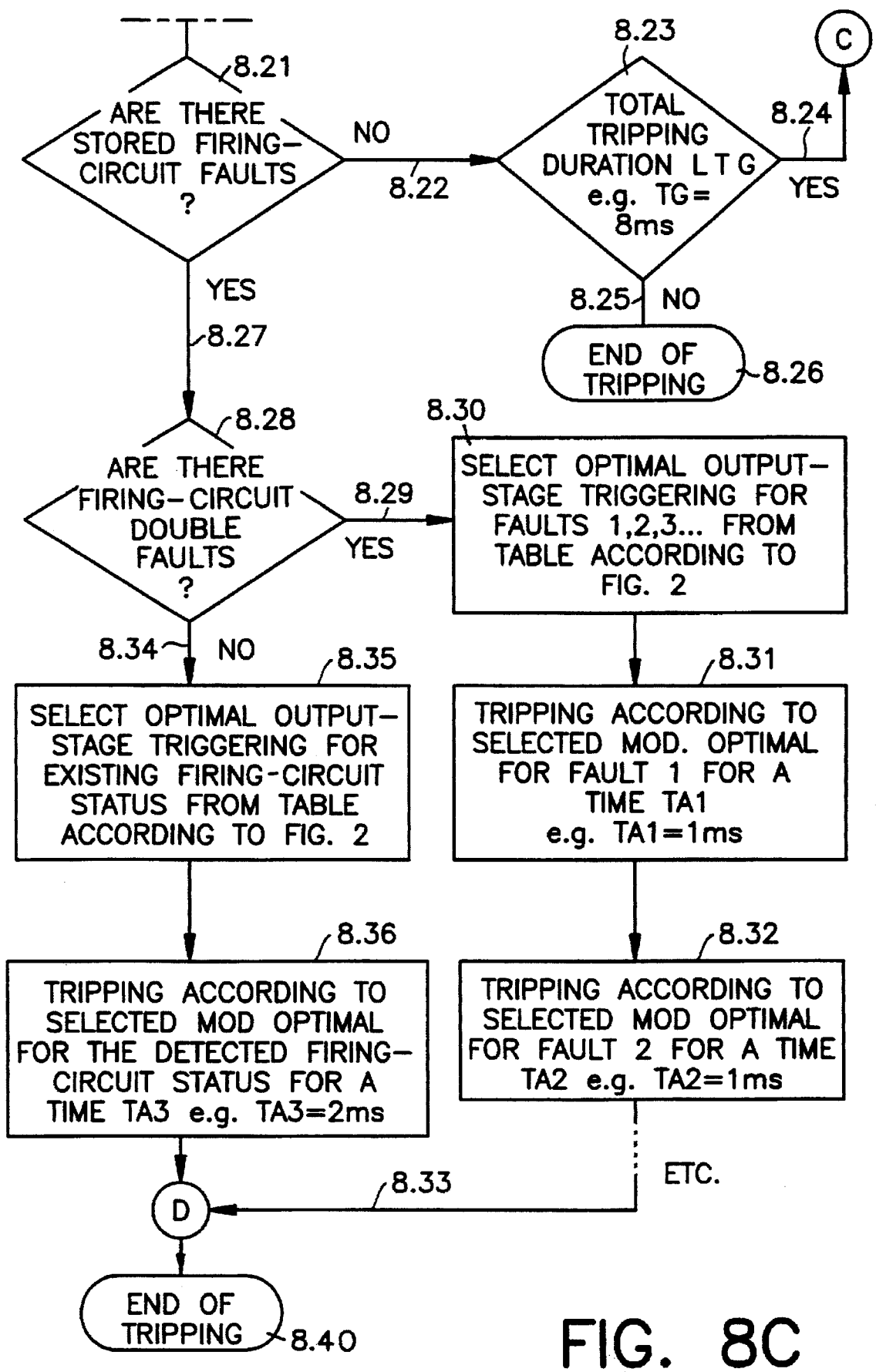

With reference to the flow charts shown in FIGS. 8a–8c, the functional sequence of the operation of the safety device according to the present invention is clarified once more. Assume that the vehicle, which is equipped with the electronic safety device, has been put into the operating state and is participating in road traffic, step 8.0. The signal evaluation takes place in the process step 8.1., i.e., the signals picked up by an acceleration-sensitive sensor 200 are evaluated by the microcomputer 20, it being ascertained whether the signals point to a serious accident situation, which would make it necessary to release the airbag 22, 23, in step 8.2. If such a situation is not ascertained, step 8.3, the signal evaluation is continued in step 8.1. When an accident situation is detected in step 8.4, it is checked in step 8.5 as to whether existing firing-circuit double faults are present or not.

If existing firing-circuit double faults are detected in step 8.6, an optimal, fault-adapted control strategy is selected in step 8.7 in accordance with the Table in FIG. 2. A control operation then follows for a certain control time, which is optimally adapted to the first detected fault type in step 8.8, for example for a time period of about 1 millisecond. The control strategy is subsequently revised (e.g., selection according to the Table of FIG. 2) in step 8.9, to then be optimally adapted for another time period of about 1 millisecond to the second detected fault.

Provided that no existing firing-circuit double fault is detected during the check test in step 8.5, the selection of an optimal triggering strategy follows in accordance with step 8.10 in conformance with the existing firing-circuit status from the Table according to FIG. 2. The triggering of the firing pellets then follows in step 8.11 in accordance with the optimized control strategy. In each case, the existing firing-circuit status is checked (for example, short-circuit detection), in turn, in step 8.12 in measuring intervals of about 100 microseconds, and the available supply voltage is measured. In step 8.13, in turn, the query is made whether firing-circuit double faults exist. Alternatively, the loop of steps 8.14, 8.15, 8.16, 8.17, 8.18 or the loop of steps 8.13, 8.19, 8.20 can then be executed, in turn. In addition, it is determined in step 8.21 whether there are possibly stored fault conditions. If that is not the case, step 8.22, it is checked in step 8.23 whether the total tripping duration is less then a specified critical duration TG (TG being approximately 8 milliseconds). If that is the case, step 8.24, the operation returns to the branch point C at step 8.4. If that is not the case, step 8.25, the end of the tripping operation is reached at step 8.26. Provided that there are stored faults (8.27), the query is made, in turn, at 8.28 whether there are firing-circuit double faults. A branching off follows then alternatively to steps 8.29, 8.30, 8.31, 8.32, to then finally return at step 8.33 to the main branch, which reaches the end of the tripping operation at step 8.40. In the case that no firing-circuit double faults are detected, step 8.34, the optimal triggering mode is selected in step 8.35, in turn, from the Table in accordance with FIG. 2. The appropriate tripping then follows at step 8.36.

Figure 9:
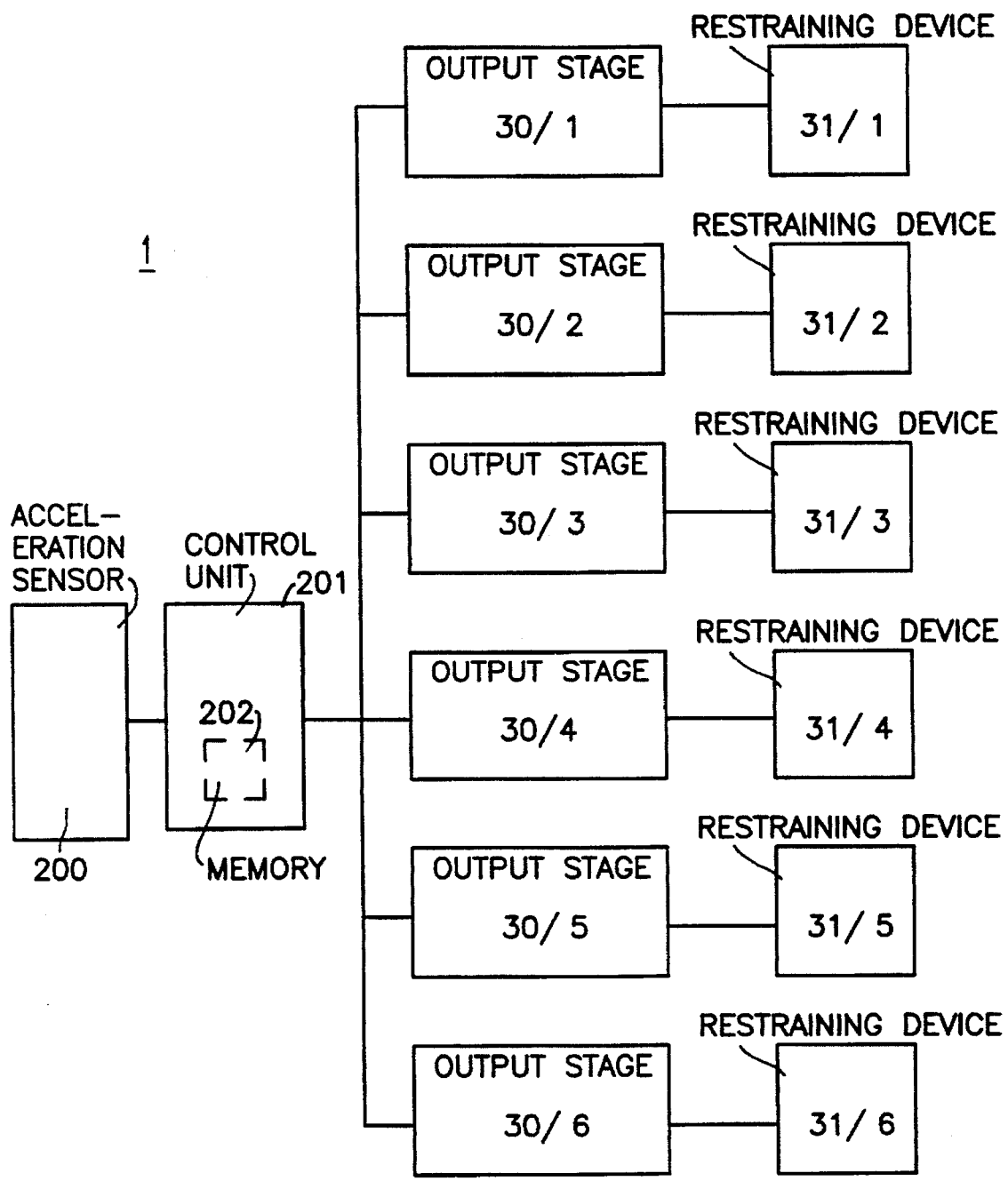
FIG. 9 illustrates, as a block diagram, a safety device according to the present invention, including a plurality of inertial restraining devices and their associated output stages.

In a block diagram, FIG. 9 depicts another exemplary embodiment of a safety device 1 according to the present invention including a sensor 200, a control unit 201 with a memory 202, and a plurality of inertial restraining devices 31/1 through 31/6 and their associated output stages 30/1 through 30/6. Output stages and restraining devices in quantities such as these are planned for late-model vehicles which come equipped with the following safety devices, for example: belt tightener for the driver; belt tightener for the front-seat passenger; airbag for the driver; airbag for the front-seat passenger; side airbag for the driver; and side airbag for the front-seat passenger. Further, one can perceive a trend today of using even more restraining devices and output stages in the future than the exemplary number given in FIG. 9 of six restraining devices or of six associated output stages, when, for example, rear-seat vehicle passengers also will be equipped with such safety devices.

Figure 10:
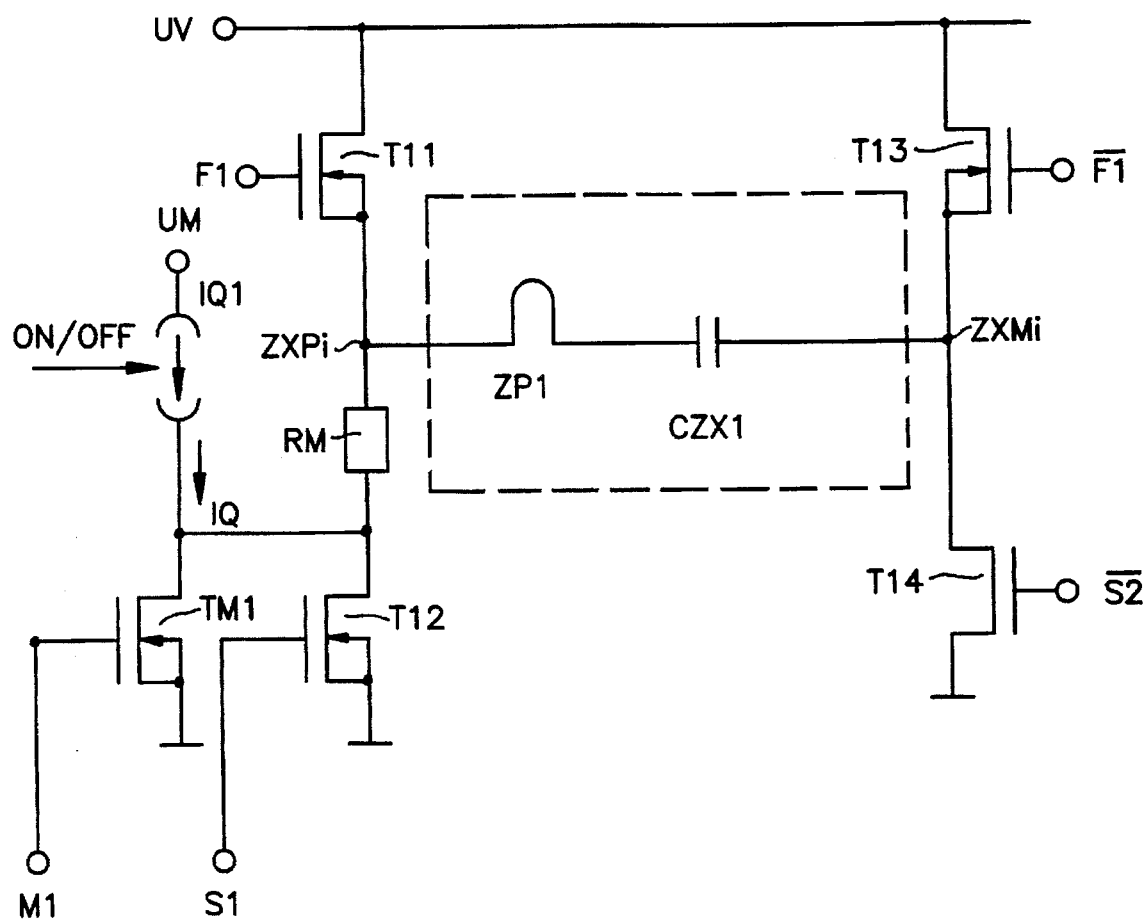
FIG. 10 illustrates a first exemplary embodiment of an output stage according to the present invention, designed using integrated technology, in which the firing pellet is arranged in a full-bridge circuit.

The output stages 30/1 through 30/6, themselves, have a relatively complex design, as a representative exemplary embodiment in accordance with FIG. 10 shows. A plurality of circuit elements T11, T12, T13, T14 are connected in series and in parallel. The exemplary embodiment of the present invention shown in FIG. 10 represents a bridge circuit, which is also described as a full bridge. Simplified variants, such as in the form of a so-called ¾-bridge and a ½-bridge, are shown illustratively in FIGS. 11 and 12. For reasons of rationalization and reliability of operation, a solution would be to manufacture the previously discussed output stages, at least essential parts of these, in an integrated form as well.

It is thus expedient, for example, to design at least the previously mentioned circuit elements as semiconductor switches, and to manufacture them using integrated technology. This can be achieved easily using present-day technical means, provided that the circuit elements are developed as power MOSFET transistors. However, in processes for integrated circuits that are capable of being controlled today, only semiconductor circuit elements are able to be manufactured whose transition resistance in the switched-on state lies in the order of magnitude of 0.5 to about 1.5 ohms. Thus, the on-resistance of these circuit elements lies, however, on the order of magnitude of the resistance of conventional firing pellets, which likewise have resistance values in the order of magnitude of a few ohms, for example, between 1 and 3 ohms. However, given such resistance conditions, the usual methods using discrete power MOSFETS for checking the firing circuits can no longer be successfully applied. In addition to this, the mentioned resistance values of the semiconductor circuit elements are still heavily temperature-dependent.

For example, if one selects the level of the discharge resistor RM to be about 10 ohms in the exemplary embodiment of the present invention according to FIG. 10, then changes in the resistance of the firing pellets in the order of magnitude of a few hundred milliohms, which are extremely significant for assessing the method of functioning of the output stage, are hardly able to be distinguished from temperature-dependent changes. This problem is solved according to the present invention in that, besides first circuit elements T11, T12, T13, T14, which make up a bridge circuit in accordance with the exemplary embodiment according to FIG. 10 and include the firing pellet ZP1 and the capacitor CZK1, second circuit elements also are provided. The circuit element TM1 in the exemplary embodiment shown in FIG. 10, has a substantially higher volume resistance value in the switched-on state. The transition resistance of the second circuit element TM1 in the switched-on state expediently amounts to ten to about one hundred times the transition resistance of the first circuit elements T11, T12, T13, T14. This is able to be achieved in manufacturing the semiconductor circuit elements in integrated technology in that a substantially smaller chip surface is provided for the second circuit element TM1.

For example, the chip surface of the second circuit elements are selected to be smaller by the factor of 10 to 100 times than the chip surface of the first circuit elements, so that in the case of the second circuit elements, the considerably larger transition resistance results in the switched-on state. Furthermore, FIG. 10 shows a current source designated by IQ1, which is connected in series to the circuit element TM1. If the first and second circuit elements are preferably manufactured using integrated technology, as mentioned, then this current source IQ1 would also be best produced using integrated technology. In the simplest form, a current source of this type can be realized, for example, as a voltage divider which is connected between the positive pole of the supply voltage and the mass frame connection. This current source IQ1 can supply a current IQ, for example, which lies in the order of magnitude between about 10 and about 100 milliamperes. A check test of the output stage shown in FIG. 10 will be clarified in greater detail in the following with the help of the second circuit element TM1, while referring to the graphs depicted in FIGS. 13a to 13c.

Figure 13A:
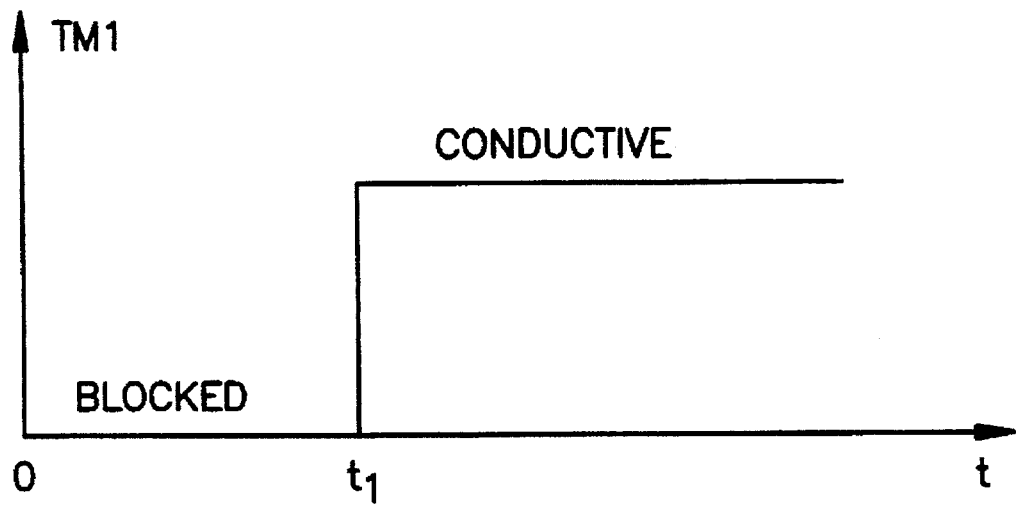
FIGS. 13a, 13b and 13c show a timing diagram corresponding to the output stage shown in FIG. 10.
Figure 13B:
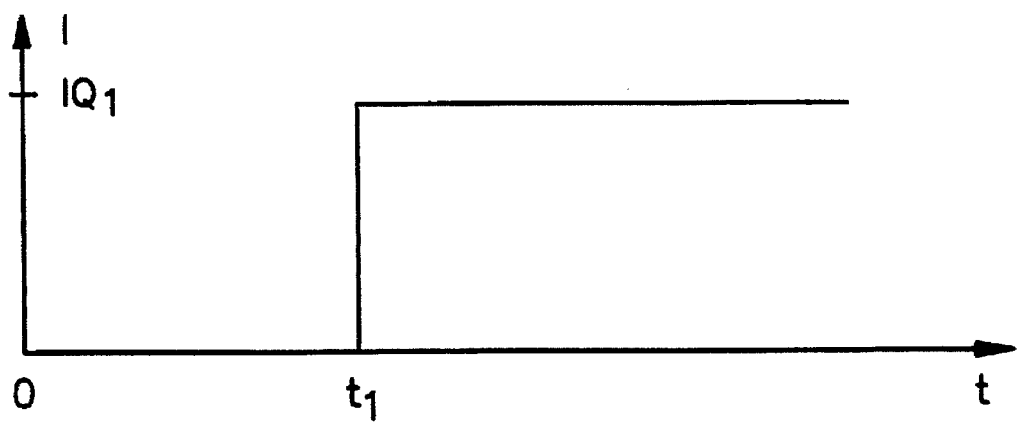

In this case, FIG. 13a illustrates the prevailing line status of the circuit element TM1; FIG. 13b the operating state of the current source IQ1; and FIG. 13c a curve which indicates the voltage characteristic as a function of time across the transition resistance of the circuit element TM1. It proceeds from FIG. 13a that the circuit element TM1 is blocked in the time interval 0 to t1 and is subsequently controlled to a conductive state. Also, the current source IQ1 is switched off in the time interval 0 to t1 and supplies the current IQ1 starting at the instant t1. The switching on of the current source IQ1 and the controlling of the circuit element TM1 are expediently effected by the control unit 201 (see FIG. 9). For that purpose, the circuit element TM1 is connected via its control terminal M1 to the control unit 201.

Figure 13C:
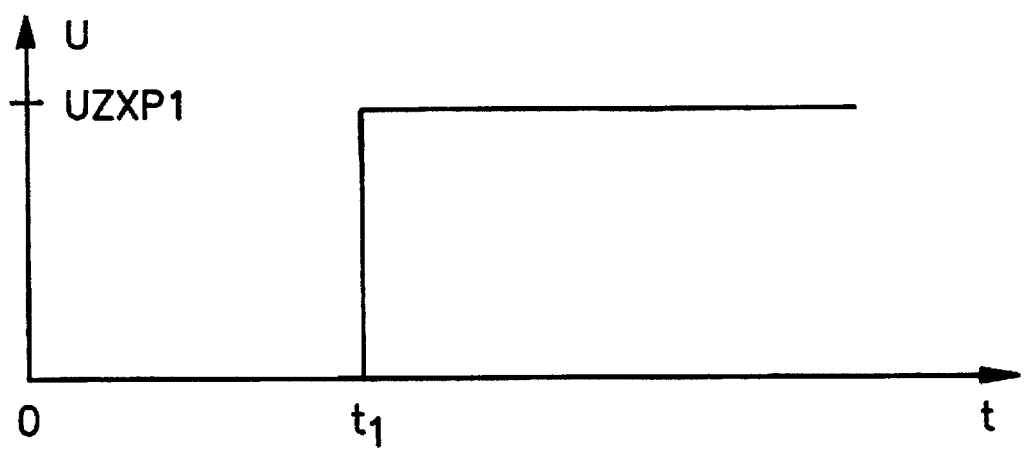

FIG. 13c shows the voltage drop UZKP1, which results across the transition resistance of the circuit element TM1 in its switched-on state as a result of the current IQ1 supplied by the current source IQ. This voltage drop results as a product of the last-mentioned current and the value of the transition resistance. This voltage drop UZKP1 is likewise expediently detected by the control unit 201 and made available for further calculations. The voltage drop that exists as an analog voltage value is thereby converted in a generally known way by means of an analog-digital converter into a corresponding digital value, which is available for further processing. From the measured voltage drop UZKP1 and the known current IQ1 of the current source IQ, the control unit 201 can determine the transition resistance of the circuit element TM1 existing at the measuring instant, under consideration of the ohmic law.

Now, however, if the value of the transition resistance of the circuit element TM1 has been determined by measuring the voltage drop UZKP1 and the current IQ1 of the current source IQ and through a subsequent calculation in accordance with ohmic law, then the value of the transition resistances of each of the circuit elements T11, T12, T13, T14 also is ascertained with a high degree of accuracy, since they are proportional to the transition resistance of the circuit element TM1 because of the surface relations of the chip surfaces.

If the transition resistances of the circuit elements T11, T12, T13, T14 are known well enough, the value of the firing pellet resistance also can be simply determined at any time with considerable accuracy with the help of a testing current conducted through the firing pellet ZP1, making it possible to infer reliable performance of the firing pellet ZP1. Tolerance ranges within the order of magnitude of a few (10) milliohms can be derived when the existing resistance value of the firing pellet ZP1 is determined, while allowing for unavoidable tolerances with respect to the testing current and the scale factor when considering the relations of the chip surfaces between the first and the second circuit elements. These comparatively small deviations make one expect that the value of the resistance of the firing pellet ZP1 can be determined with great enough accuracy, so that occurring faults can be reliably determined in a timely manner.

Figure 11:
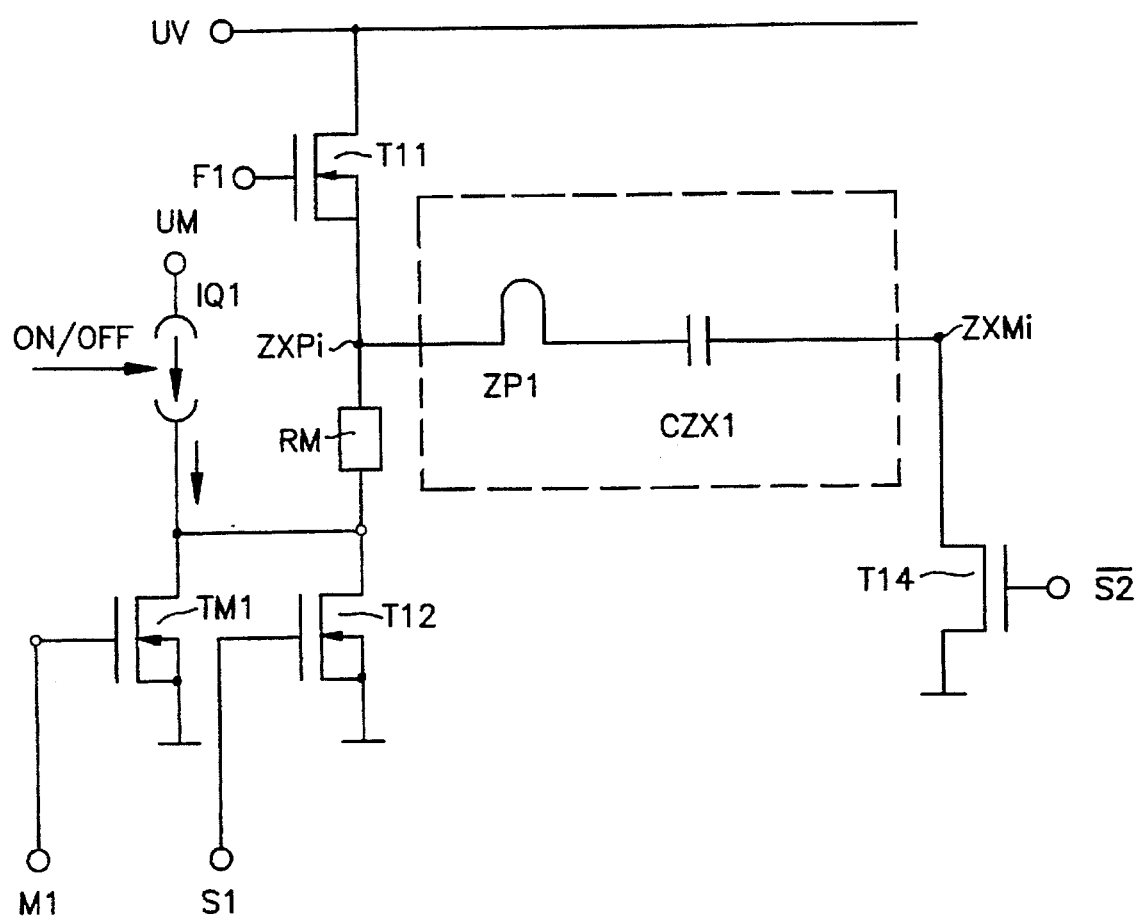
FIG. 11 illustrates a second exemplary embodiment of an output stage according to the present invention, designed using integrated technology, in which the firing pellet is arranged in a ¾ bridge.
Figure 12:
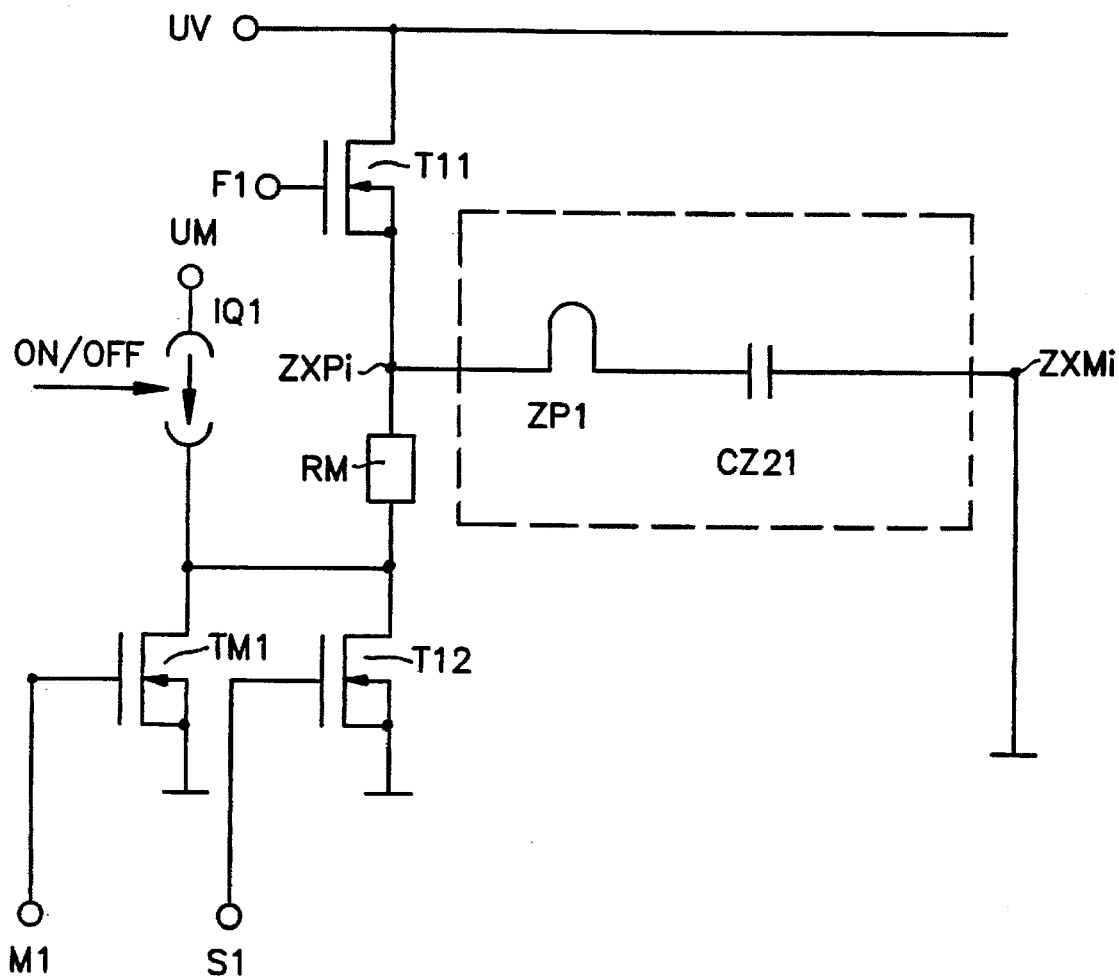
FIG. 12 illustrates a third exemplary embodiment of an output stage according to the present invention, designed using integrated technology, in which the firing pellet is arranged in a ½ bridge.

Comparable advantages are revealed by the exemplary embodiments of the output stages shown in simplified representations in FIGS. 11 and 12. FIG. 10, FIG. 11, and FIG. 12 each depict only one output stage with only one firing pellet ZP1. As shown in FIG. 9, many such output stages can be provided, and could then have assigned to each of them only one single second circuit element TM1 and an associated current source IQ. In the case that all output stages 30/1 through 30/6 are integrated on one single circuit element, one could, of course, also conceive of jointly providing a second circuit element TM1 of this type and a single current source IQ for all output stages.

In the case of the exemplary embodiments of the present invention described below, it is possible to detect and consider the transition resistance of circuit elements produced, in particular, using integrated technology. In this case, an additional reference branch is provided, while in contrast to the previously described exemplary embodiments, a special current source is not required. Two push/pull output stages designed as a bridge circuit for triggering one firing circuit C1, R1 or C3, R3 each are provided in the exemplary embodiment shown in FIG. 14. C1 and C3, in turn, are capacitors, which are each connected in series to one of their firing pellets, represented by the resistors R1, R3. In the case of the circuit elements S1, S2, S3, S4, S9 of the first output stage and S5, S6, S7, S8, S10 of the second output stage, the circuit elements are produced, for example, using integrated technology, particularly MOS transistors.

A reference branch including the series connection of a capacitor C2 and the resistor R2 is connected between the output stages. UB describes the operating voltage. A resistance measurement can be performed as follows. First, the circuit element S4 is closed. By closing the circuit element S9, the series circuit of the firing circuit C1, R1 is connected to the operating voltage UB, and the capacitor C1 is charged. The capacitance value of the capacitor C1 can be determined from the charging curve. By briefly closing the circuit elements S2 and S4 for a specific time t, the capacitor C1 is discharged via the resistor R1 of the firing circuit. The voltage still being applied to the capacitor C1 is a measure for the value of the resistor R1, it being necessary to make a correction in dependence upon the previously described measuring operation. The transition resistances of the circuit elements S2 and S4 also enter as disturbance variables in the described resistance measurement. These transition resistances are subject to manufacturing tolerances and, as a rule, are also heavily temperature-dependent. Accordingly, in the case of the previously described second measuring step, it is not the resistance value of the resistor R1 that is measured, but rather a resistance value, which is a sum of the resistance value of the resistor R1 and of the double transition resistance (circuit elements S2, S4).

Figure 14:
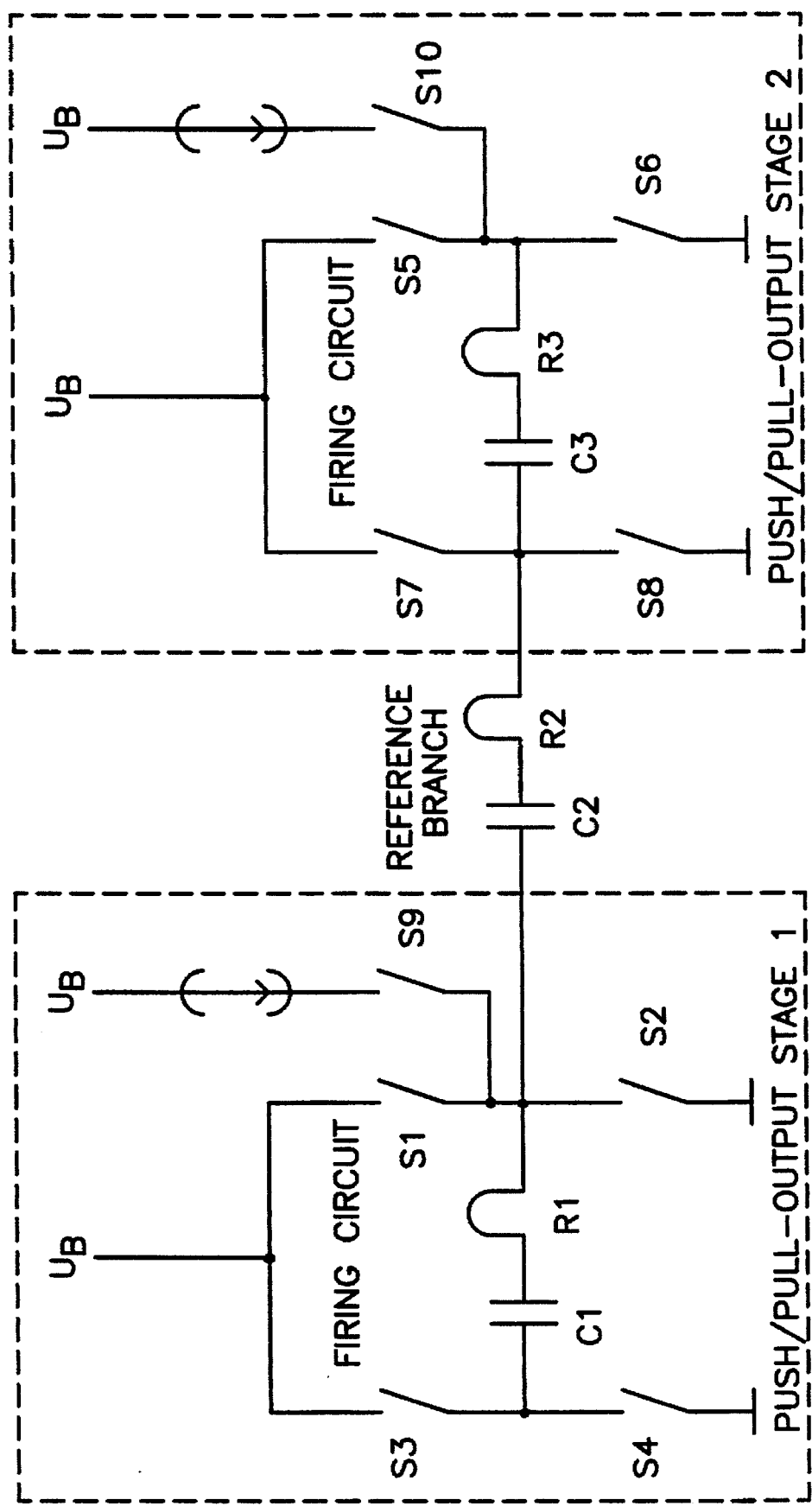
FIGS. 14, 15 and 16 show additional exemplary embodiments of an output stage including a reference branch according to the present invention.

To enable the transition resistance to now be determined for purposes of correction, a comparison measurement is made in a reference branch including the capacitor C2 and the resistor R2. The reference branch including C2 and R2 is situated between two push/pull output stages which each trigger a firing circuit C1, R1 or C3, R3. As depicted in FIG. 14, these push/pull output stages can be designed as full bridges, or, by omitting the circuit elements S3, S7, also as ¾ bridges. Such an arrangement of the reference branch C2, R2 makes it possible for the reference resistance of this reference branch to be measured without additional other components. The measurement of the resistance in the reference branch follows essentially in the same way as the previously described measurements.

Thus, initially, by closing the circuit elements S8, S9, the capacitor C2 of the reference branch is charged. On the other hand, by closing the circuit elements S2, S8, the capacitor C2 is at least partially discharged. As already mentioned above, a resistance value in the reference branch can be determined from this discharge operation. However, the measuring result represents the sum of the value of the reference resistor R2 and the transition resistances of the circuit elements S2 and S8. However, since the resistance of the reference resistor R2 in the reference branch is known, the transition resistance of the circuit elements S2, S8 in the closed state can now be calculated. With the help of this now known transition resistance, it is possible to correct the resistance value of the resistor R1 (or R3) in the firing circuits that was determined using the previously described measuring operations.

When the circuit elements S1 to S8 are integrated in integration technology, the variation (spread) among the transition resistances of these circuit elements is very small, since, on the one hand, the variation in the parameters on the same integrated circuit is small and, on the other hand, all circuit elements essentially have the same operating temperature. Accordingly, by applying the described reference measurement, it is possible to almost entirely correct the influence of the transition resistances of the circuit elements on the resistance value of the firing circuits. If an output-stage circuit is not operated with just two output stages, as shown in FIG. 14, but with even more, for example with four complete bridge circuits, then it is still only necessary to have one single reference branch for each integrated circuit, in order to make the necessary correction.

To ensure that no energy is lost in the reference branch C2, R2 when the firing circuits C1, R1 or C3, R3 are triggered simultaneously, the circuit element S1 is clocked simultaneously with the circuit element S7, and the circuit element S2 simultaneously with the circuit element S8. If only one firing circuit is supposed to be triggered, thus, for example, only the firing circuit C1, R1, then the circuit elements of the second firing circuit C3, R3 are not closed.

Figure 15:
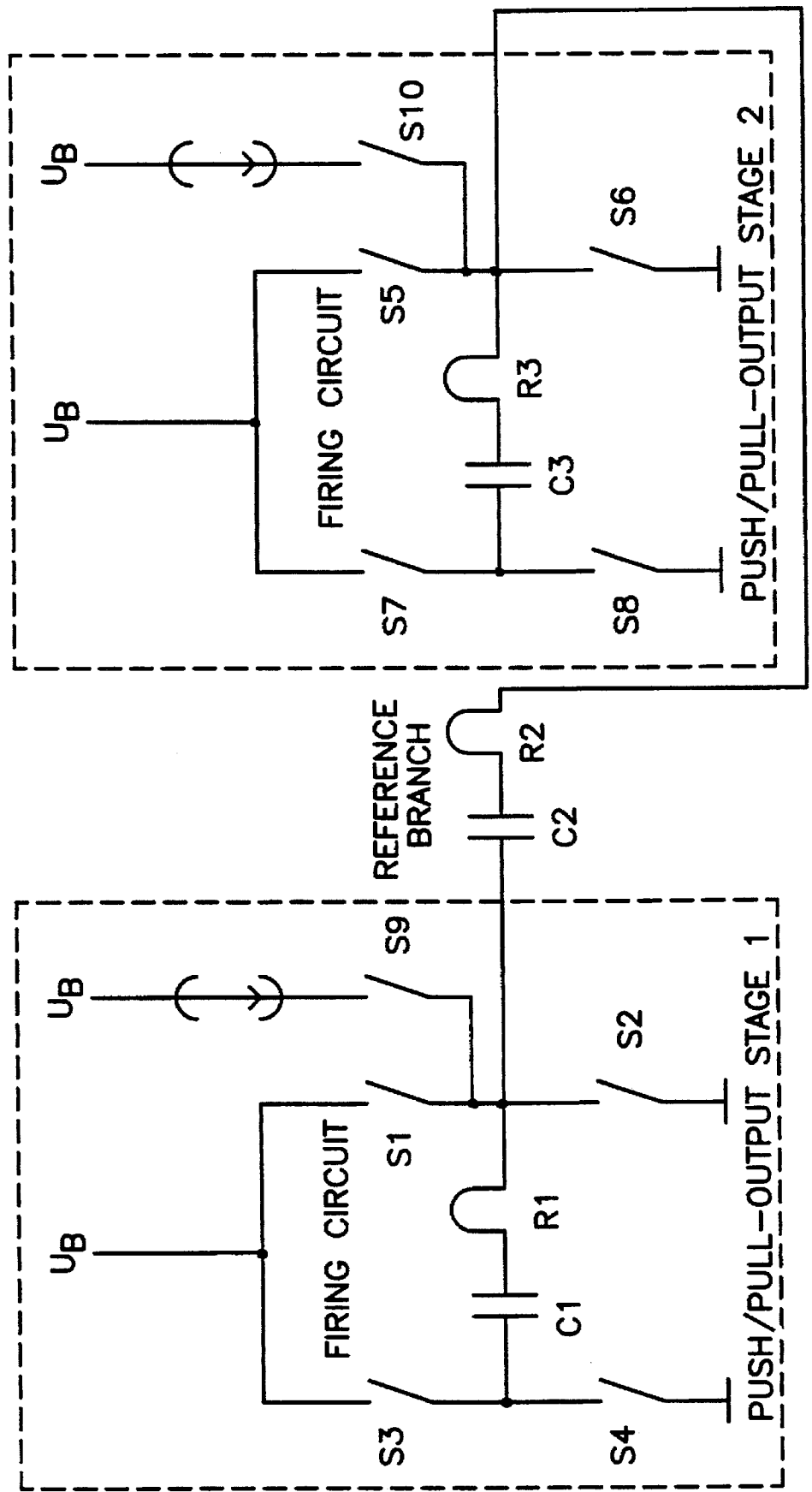

FIG. 15 shows a variant of the circuit arrangement depicted in FIG. 14. In this variant, the connection of the resistor R2 of the reference branch facing away from the capacitor C2 of the reference branch is now connected to the connection of the resistor R3 facing away from the capacitor C3 of the second firing circuit. The measuring steps described already in connection with FIG. 14 also apply to this arrangement. However, in the case of the firing-circuit measurement, instead of the circuit element S8, the circuit element S6 is triggered and, during the firing, the circuit element S10 is triggered simultaneously with the circuit element S5, and the circuit element S2 simultaneously with the circuit element S6.

Figure 16:
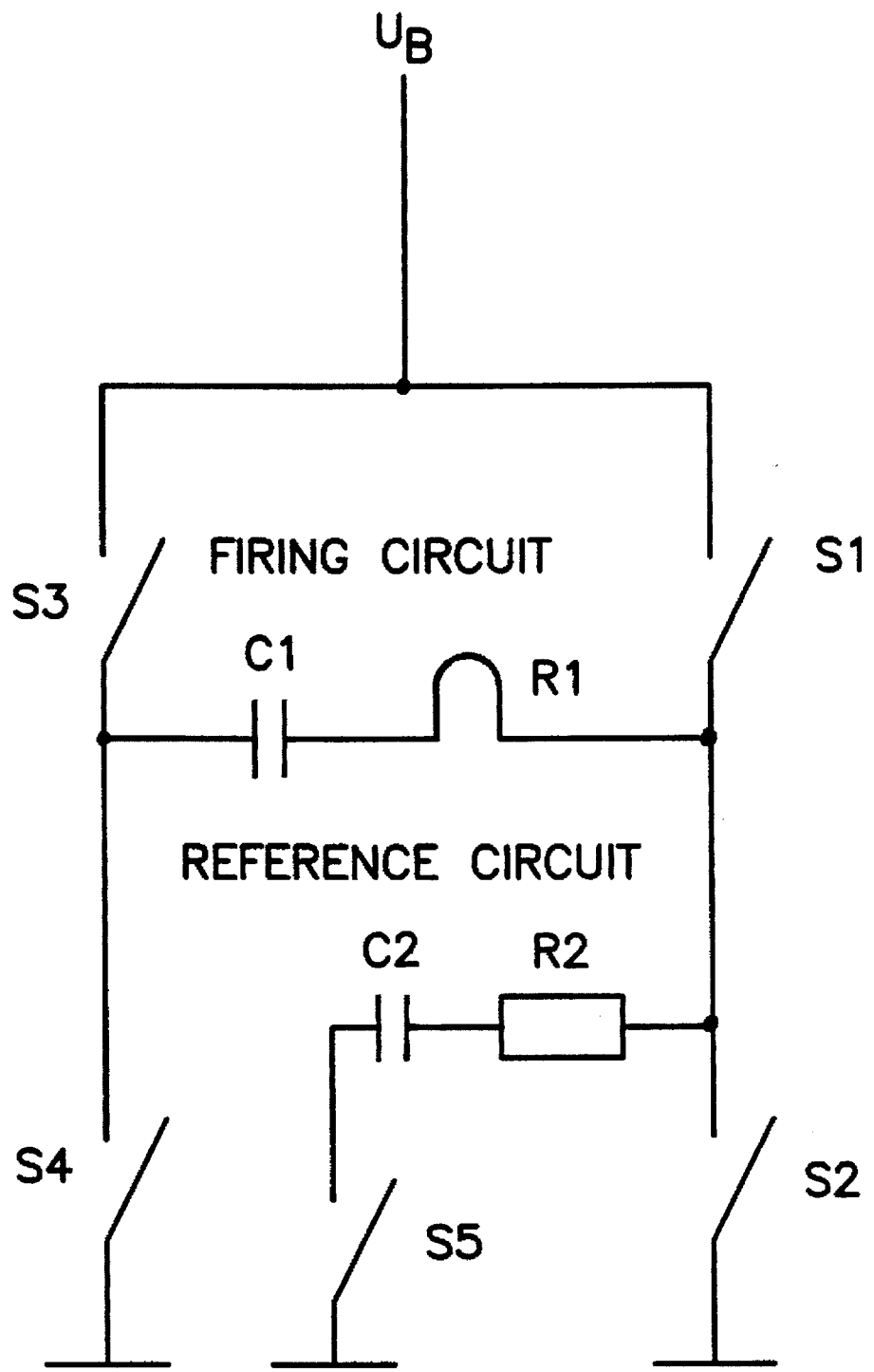

Another specific embodiment of the circuit arrangement according to the present invention is shown in FIG. 16, the illustration being limited to merely one full-bridge circuit. One of these full-bridge circuits of the output stage designed in integrated technology receives, in addition, another circuit element S5, which is preferably likewise an output-stage transistor that is designed in MOS technology and is essentially identical in construction to the circuit elements S2 or S4. The reference circuit with the capacitor C2 and the resistor R2 provided for measuring purposes is now included between one pole each of the circuit element S5 and the circuit element S2. If the intention is to merely design the output stage shown in FIG. 16 as a ¾-bridge, then the circuit element S3 can be dropped.

What is claimed is:

1. An electronic safety device for occupants of a vehicle including an acceleration-sensitive sensor and at least one inertial restraining device, the safety device comprising:

a control unit coupled to the acceleration-sensitive sensor, the control unit including at least one microcomputer;

at least one output stage coupled to the control unit and controlling the at least one inertial restraining device, the at least one output stage including a squib; and a memory device coupled to the at least one microcomputer, at least one fault condition of the electronic safety device and at least one associated control command being stored in the memory device, wherein the at least one inertial restraining device is activated in accordance with the at least one control command when the at least one fault condition occurs.

2. The electronic safety device according to claim 1, wherein a supply voltage is applied to the safety device, and wherein the control command is determined as a function of the supply voltage.

3. The electronic safety device according to claim 2, wherein the at least one output stage includes at least one first switching element, and wherein when the supply voltage is in a range of 30 volts to 45 volts and a short circuit condition exists between the squib and a positive pole of the supply voltage, the at least one first switching element is triggerable as a function of a clock-pulse timing signal, the at least one first switching element being in a conductive state during a first time interval and being in a blocked state during a second time interval.

4. The electronic safety device according to claim 3, wherein the at least one output stage further includes at least two second switching elements, and wherein during the second time interval, the at least two second switching elements are in the conductive state.

5. The electronic safety device according to claim 4, wherein the at least one first switching element and the at least two second switching elements include semiconductor elements.

6. The electronic safety device according to claim 3, wherein the first time interval has a duration equal to the second time interval.

7. The electronic safety device according to claim 3, wherein the first time interval has a duration in a range of 5 microseconds to 10 microseconds.

8. The electronic safety device according to claim 7, wherein the duration is 7 microseconds.

9. The electronic safety device according to claim 3, wherein the at least one output stage further includes at least two third switching elements, and wherein during the first and second time intervals, the at least two third switching elements are in one of the conductive state and the blocked state.

10. The electronic safety device according to claim 2,
   wherein the at least one output stage includes at least one first switching element and at least two second switching elements, and
   wherein when the supply voltage is in a range of 24 volts to 30 volts and a short circuit exists between the squib and one of a positive pole of the supply voltage and a ground connection, the at least one first switching element is triggerable as a function of a clock-pulse timing signal, the at least one first switching element being in a conductive state during a first time interval and being in a blocked state during a second time interval, the at least two second switching elements being in the conductive state when the at least one first switching element is in the blocked state.

11. The electronic safety device according to claim 10, wherein the first and second time intervals have a duration in a range of 3 microseconds to 10 microseconds.

12. The electronic safety device according to claim 10, wherein the first and second time intervals have a duration of 5 microseconds.

13. The electronic safety device according to claim 2,
   wherein the at least one output stage includes at least two first switching elements, at least two second switching elements and at least two third switching elements, and
   wherein when the supply voltage is in a range of 9 volts to 24 volts and a short circuit exists between the squib and a positive pole of the supply voltage, the at least two first switching elements, the at least two second switching elements and the at least two third switching elements are selectably triggerable in a push-pull operation as a function of a clock-pulse timing signal, a first subset of the at least two first switching elements, the at least two second switching elements and the at least two third switching elements being in a conductive state during a first time interval, a second subset of the at least two first switching elements, the at least two second switching elements and the at least two third switching elements being in a blocked state during the first time interval, the first subset being in a conductive state during a second time interval and the second subset being in a blocked state during the second time interval.

14. The electronic safety device according to claim 13, wherein the first and second time intervals have a duration in a range of 2 microseconds to 8 microseconds.

15. The electronic safety device according to claim 13, wherein the first and second time intervals have a duration of 3 microseconds.

16. The electronic safety device according to claim 2, wherein the at least one output stage includes at least one first switching element, at least two second switching elements and a capacitor connected in series to the squib, and
   wherein when the supply voltage is in a range of 30 volts to 45 volts and a short circuit exists between a terminal of the capacitor and one of a positive pole of the supply voltage and a ground connection, the at least one first switching element is triggerable as a function of a clock-pulse timing signal, the at least one first switching element being in a conductive state during a first time interval and being in a blocked state during a second time interval, the at least two second switching elements being in the blocked state during the first time interval and being in the conductive state during the second time interval.

17. An electronic safety device for occupants of a vehicle including an acceleration-sensitive sensor and at least one inertial restraining device, the safety device comprising:
   a control unit coupled to the acceleration-sensitive sensor, the control unit including at least one microcomputer; and
   at least one output stage coupled to the control unit and controlling the at least one restraining device, the output stage including a plurality of first switching elements and a plurality of second switching elements, the plurality of first and second switching elements manufactured using integrated circuit technology, wherein each of the plurality of first and second switching elements assumes one of an ON-state and an OFF-state, a second transition resistance of each of the plurality of second switching elements being greater than a first transition resistance of each of the plurality of first switching elements.

18. The electronic safety device according to claim 17, wherein when one of the plurality of second switching elements is in the ON-state, the second transition resistance of the second switching element is greater than the first transition resistance of one of the plurality of first switching elements by a factor in a range of 10 to 100.

19. The electronic safety device according to claim 17, further comprising a reference branch circuit for determining one of the first transition resistance of one of the plurality of first switching elements and the second transition resistance of one of the plurality of second switching elements, the reference branch circuit including a capacitor coupled in series with a resistor, the capacitor being capable of one of charging and discharging as a function of the state of at least one of the plurality of first and second switching elements.

* * * * *

UNITED STATES PATENT AND TRADEMARK OFFICE
CERTIFICATE OF CORRECTION

PATENT NO. : 5,646,454

DATED : July 8, 1997

INVENTOR(S) : Bernhard Mattes et al.

It is certified that error appears in the above-identified patent and that said Letters Patent is hereby corrected as shown below:

Column 4, line 31, "2" should be -- 12 --.

Signed and Sealed this

Twentieth Day of January, 1998

Attest:

BRUCE LEHMAN

Attesting Officer

Commissioner of Patents and Trademarks